United States Patent
Kim et al.

(10) Patent No.: US 8,385,122 B2
(45) Date of Patent: Feb. 26, 2013

(54) NON-VOLATILE MEMORY DEVICE HAVING STACKED STRUCTURE, AND MEMORY CARD AND ELECTRONIC SYSTEM INCLUDING THE SAME

(75) Inventors: Won-joo Kim, Hwaseong-si (KR); Yoon-dong Park, Yongin-si (KR); Jung-hun Sung, Yongin-si (KR); Yong-koo Kyoung, Seoul (KR); Sang-moo Choi, Yongin-si (KR); Tae-hee Lee, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 389 days.

(21) Appl. No.: 12/656,043

(22) Filed: Jan. 14, 2010

(65) Prior Publication Data
US 2010/0177566 A1    Jul. 15, 2010

(30) Foreign Application Priority Data
Jan. 14, 2009    (KR) .................... 10-2009-0003016

(51) Int. Cl.
*G11C 16/04*    (2006.01)
*H01L 29/788*    (2006.01)

(52) U.S. Cl. ............... 365/185.17; 365/185.11; 257/315; 257/E29.3

(58) Field of Classification Search ............. 365/185.11, 365/185.17; 257/314–316, 686, E29.3
See application file for complete search history.

(56) References Cited

U.S. PATENT DOCUMENTS

| | | | |
|---|---|---|---|
| 6,151,249 A * | 11/2000 | Shirota et al. ............. | 365/185.17 |
| 6,850,439 B1 * | 2/2005 | Tanaka ...................... | 365/185.17 |
| 8,004,893 B2 * | 8/2011 | Sim et al. .................. | 365/185.05 |
| 2006/0233082 A1 | 10/2006 | Lee | |
| 2007/0158736 A1 | 7/2007 | Arai | |
| 2008/0031048 A1 | 2/2008 | Jeong | |
| 2010/0020608 A1 * | 1/2010 | Kamigaichi et al. ..... | 365/185.05 |

FOREIGN PATENT DOCUMENTS

| | | |
|---|---|---|
| JP | 2007-180389 | 7/2007 |
| KR | 2008-0012667 | 2/2008 |

* cited by examiner

*Primary Examiner* — Allison P Bernstein
(74) *Attorney, Agent, or Firm* — Harness, Dickey & Pierce, P.L.C.

(57) ABSTRACT

Provided are a non-volatile memory devices having a stacked structure, and a memory card and a system including the same. A non-volatile memory device may include a substrate. A stacked NAND cell array may have at least one NAND set and each NAND set may include a plurality of NAND strings vertically stacked on the substrate. At least one signal line may be arranged on the substrate so as to be commonly coupled with the at least one NAND set.

31 Claims, 29 Drawing Sheets

NON-VOLATILE MEMORY DEVICE HAVING STACKED STRUCTURE, AND MEMORY CARD AND ELECTRONIC SYSTEM INCLUDING THE SAME

CROSS-REFERENCE TO RELATED APPLICATIONS

This application claims priority under 35 U.S.C. §119 to Korean Patent Application No. 10-2009-0003016, filed on Jan. 14, 2009, in the Korean Intellectual Property Office (KIPO), the entire contents of which are herein incorporated by reference.

BACKGROUND

1. Field

Example embodiments relate to a semiconductor device, and more particularly, to a non-volatile memory device and a memory card and a system including the same.

2. Description of the Related Art

In the conventional art, relatively small electronic devices are required to process relatively large amounts of data. Accordingly, non-volatile memory devices used in such electronic devices are relatively small and highly integrated. Some conventional non-volatile memory devices have a stacked structure instead of a typical planar structure. However, arrangement of and connection between a cell array and a peripheral circuit are relatively complicated in the stacked structure, which limits integration of the non-volatile memory device.

SUMMARY

Example embodiments relate to a semiconductor device, and more particularly, to a non-volatile memory device and a memory card and a system including the same.

In accordance with example embodiments, a non-volatile memory device having a stacked structure may include a substrate, a stacked NAND cell array having at least one NAND set, the at least one NAND set including a plurality of NAND strings vertically stacked on the substrate, and at least one signal line on the substrate and coupled with the at least one NAND set.

In accordance with example embodiments a non-volatile memory device having a stacked structure may include a substrate, and a plurality of NAND blocks stacked on the substrate, wherein each of the NAND blocks include a stacked NAND cell array having at least one NAND set, the at least one NAND set including a plurality of NAND strings vertically stacked on the substrate, and at least one signal line on the substrate and coupled with the at least one NAND set.

In accordance with example embodiments, a non-volatile memory device having a stacked structure may include a substrate, at least one set of semiconductor layers vertically stacked on the substrate, a plurality of control gate electrodes on at least one side surface of the at least one set of semiconductor layers and vertically extending on the substrate across the at least one set of semiconductor layers, and at least one bit line on the substrate and commonly connected to the at least one set of semiconductor layers.

According to example embodiments, there is provided an example of a non-volatile memory device having a stacked structure. In accordance with example embodiments, the example non-volatile memory device may include a substrate, a stacked NAND cell array having at least one NAND set, each NAND set including a plurality of NAND strings vertically stacked on the substrate, and at least one signal line arranged on the substrate and commonly coupled with the at least one NAND set.

The at least one signal line may include a bit line commonly connected to one end of each NAND set and/or at least one common source line commonly connected to the other end of the at least one NAND set.

The at least one signal line may further include a plurality of string selection lines commonly coupled with a plurality of string selection transistors of the at least one NAND set, a plurality of word lines commonly coupled with the plurality of memory cells of the at least one NAND set, and/or at least one ground selection line commonly coupled with at least one ground selection transistor of the at least one NAND set.

The at least one NAND set may include a plurality of NAND sets arranged on the substrate in a row. The at least one signal line may include a plurality of bit lines, and each bit line may be commonly connected to each NAND set.

The at least one signal line may be arranged under the stacked NAND cell array and may be coupled with the at least one NAND set via at least one vertical plug on the substrate.

The non-volatile memory device may further include a core circuit unit on the substrate and the core circuit unit may be electrically connected to the at least one signal line under the stacked NAND cell array According to example embodiments, there is provided an example non-volatile memory device having a stacked structure. The example non-volatile memory device may include a substrate, a stacked NAND cell array having at least one NAND set, each NAND set including a plurality of NAND strings vertically stacked on the substrate, and at least one signal line arranged on the substrate and commonly coupled with the at least one NAND set. Each NAND string may include a plurality of string selection transistors. The at least one signal line may include a bit line commonly connected to one end of each NAND set, and a plurality of string selection lines commonly coupled with the plurality of string selection transistors of the at least one NAND set. The plurality of string selection transistors of each NAND string may include at least one depletion-mode string selection transistor.

According to example embodiments, there is provided an example of a non-volatile memory device having a stacked structure. The example non-volatile memory device may include a substrate, a stacked NAND cell array having at least one first NAND set, each first NAND set including a plurality of first NAND strings vertically stacked on the substrate, and at least one second NAND set, each second NAND set including a plurality of second NAND strings arranged to face the plurality of the first NAND strings, and at least one signal line arranged on the substrate and commonly coupled with at least one NAND set from among the at least one first NAND set and the at least one second NAND set.

The at least one signal line may include at least one bit line commonly connected to ends of the at least one first NAND set and the at least one second NAND set, and/or at least one common source line commonly connected to other ends of the at least one first NAND set and the at least one second NAND set.

The at least one signal line may further include a plurality of first string selection lines commonly coupled with the at least one first NAND set and a plurality of second string selection lines commonly coupled with the at least one second NAND set, a plurality of first word lines commonly coupled with the at least one first NAND set and a plurality of second word lines commonly coupled with the at least one second NAND set, and/or at least one first ground selection line commonly coupled with the at least one first NAND set and at least one second ground selection line commonly coupled with the at least one second NAND set.

According to example embodiments, there is provided an example of a non-volatile memory device having a stacked structure. The example non-volatile memory device may include a substrate, and a plurality of NAND blocks stacked on the substrate. Each NAND block may include a stacked NAND cell array having at least one NAND set, each NAND set including a plurality of NAND strings vertically stacked on the substrate, and at least one signal line arranged on the substrate and commonly coupled with the at least one NAND set.

According to example embodiments, there is provided an example of a non-volatile memory device having a stacked structure. The example non-volatile memory device may include a substrate, at least one set of semiconductor layers vertically stacked on the substrate, a plurality of control gate electrodes arranged on at least one side surface of the at least one set of semiconductor layers and vertically extending on the substrate across the at least one set of semiconductor layers, and at least one bit line arranged on the substrate and commonly connected to the at least one set of semiconductor layers.

According to example embodiments, there is provided an example of a non-volatile memory device having a stacked structure. The example non-volatile memory device may include a substrate, at least one set of semiconductor layers vertically stacked on the substrate, a plurality of first control gate electrodes arranged on at least one side surface of the at least one set of semiconductor layers and vertically extending on the substrate across the at least one set of semiconductor layers, a plurality of second control gate electrodes arranged on the other side surface of the at least one set of semiconductor layers opposite to the plurality of first control gate electrodes and vertically extending on the substrate across the at least one set of semiconductor layers, and at least one bit line commonly connected to the at least one set of semiconductor layers.

According to example embodiments, there is provided an example of a memory card. The example memory card may include a memory unit including one of the above-described non-volatile memory devices and a controller unit controlling the memory unit.

According to example embodiments, there is provided an example of an electronic system. The example electronic system may include a memory unit including one of the above-described non-volatile memory devices, a processor unit communicating with the memory unit via a bus, and an input/output device communicating with the bus.

BRIEF DESCRIPTION OF THE DRAWINGS

Example embodiments will be more clearly understood from the following detailed description taken in conjunction with the accompanying drawings.

FIG. 1 is a perspective view of a non-volatile memory device according to example embodiments;

FIG. 2 is a circuit diagram of a non-volatile memory device according to example embodiments;

FIG. 3 is a circuit diagram of a non-volatile memory device according to example embodiments;

FIG. 4 is a circuit diagram for describing a method of selecting NAND strings in the non-volatile memory device illustrated in FIG. 3;

FIG. 5 is a circuit diagram of a non-volatile memory device according to example embodiments;

FIGS. 6 and 7 are circuit diagrams for describing a method of selecting NAND strings in the non-volatile memory device illustrated in FIG. 5;

FIGS. 8 and 9 are circuit diagrams for describing a method of operating the non-volatile memory device illustrated in FIG. 2;

FIG. 10 is a perspective view of a non-volatile memory device according to example embodiments;

FIG. 11 is a plan view of the non-volatile memory device illustrated in FIG. 10;

FIG. 12 is a cross-sectional view taken along a line XII-XII' of the non-volatile memory device illustrated in FIG. 11;

FIG. 13 is a cross-sectional view taken along a line XIII-XIII' of the non-volatile memory device illustrated in FIG. 11;

FIG. 14 is a circuit diagram of a non-volatile memory device according to example embodiments;

FIG. 15 is a plan view of the non-volatile memory device illustrated in FIG. 14;

FIG. 16 is a plan view of a non-volatile memory device according to example embodiments;

FIG. 17 is a circuit diagram of a non-volatile memory device according to example embodiments;

FIG. 18 is a perspective view of a non-volatile memory device according to example embodiments;

FIG. 19 is a plan view of the non-volatile memory device illustrated in FIG. 18;

FIG. 20 is a circuit diagram of a non-volatile memory device according to example embodiments;

FIG. 21 is a perspective view of a non-volatile memory device according to example embodiments;

FIG. 22 is a circuit diagram of a non-volatile memory device according to example embodiments;

FIGS. 23 through 26 are cross-sectional views for describing a method of manufacturing a non-volatile memory device, according to example embodiments;

FIG. 27 is a perspective view of a non-volatile memory device according to example embodiments;

FIG. 28 is a block diagram of a non-volatile memory device according to example embodiments;

FIG. 29 is a schematic diagram of a memory card according to example embodiments; and FIG. 30 is a block diagram of an electronic system according to example embodiments.

DETAILED DESCRIPTION

Figure 1:
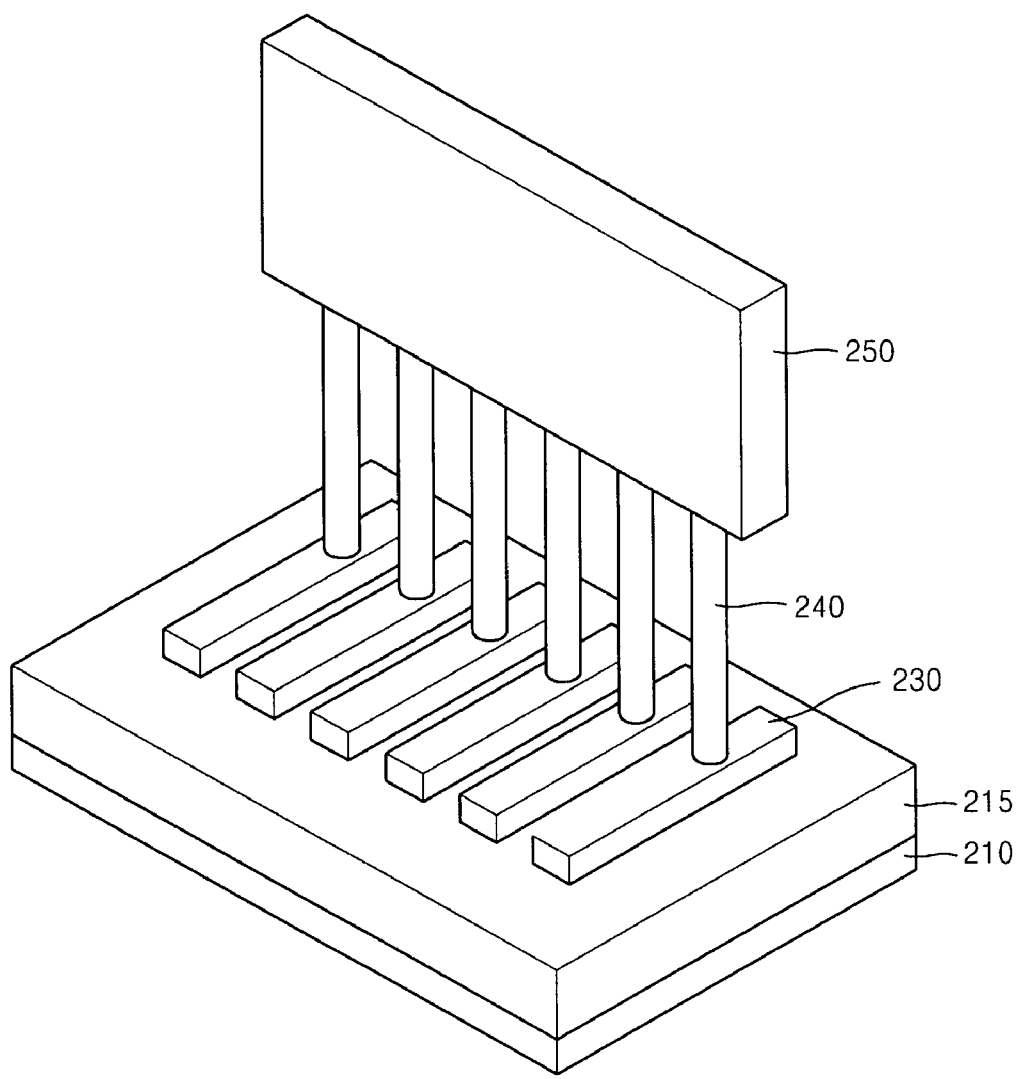
FIGS. 1-30 represent non-limiting, example embodiments as described herein.

Example embodiments will now be described more fully with reference to the accompanying drawings, in which example embodiments are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the sizes of components may be exaggerated for clarity.

It will be understood that when an element or layer is referred to as being "on", "connected to", or "coupled to" another element or layer, it can be directly on, connected to, or coupled to the other element or layer or intervening elements or layers that may be present. In contrast, when an element is referred to as being "directly on", "directly connected to", or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. Thus, a first element, component, region, layer, or section discussed below could be termed a second element, component, region, layer, or section without departing from the teachings of example embodiments.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments described herein will refer to plan views and/or cross-sectional views by way of ideal schematic views. Accordingly, the views may be modified depending on manufacturing technologies and/or tolerances. Therefore, example embodiments are not limited to those shown in the views, but include modifications in configuration formed on the basis of manufacturing processes. Therefore, regions exemplified in figures have schematic properties and shapes of regions shown in figures exemplify specific shapes or regions of elements, and do not limit example embodiments.

Hereinafter, example embodiments will be described in detail with reference to the attached drawings. Example embodiments, however, be embodied in many different forms and should not be construed as being limited to the embodiments set forth herein; rather, example embodiments are provided so that this disclosure will be thorough and complete. In the drawings, the sizes of elements may be exaggerated for clarity.

FIG. 1 is a perspective view of a non-volatile memory device according to example embodiments.

Referring to FIG. 1, a substrate 210 is provided. The substrate 210 may contain a semiconductor material such as a IV group semiconductor, a III-V group compound semiconductor, or a II-VI group oxide semiconductor. For example, the IV group semiconductor may contain silicon, germanium, or silicon-germanium. The substrate 210 may be provided as a bulk wafer or an epitaxial layer.

A stacked NAND cell array 250 may be provided on the substrate 210. The stacked NAND cell array 250 may include NAND strings (not shown) vertically stacked on the substrate 210. The structure of the stacked NAND cell array 250 will be described in detail later.

At least one signal line, e.g., a plurality of signal lines 230, may be coupled with the stacked NAND cell array 250. For example, the signal lines 230 may be provided under the stacked NAND cell array 250 and may be provided on the substrate 210 by interposing an insulating layer 215 therebetween. The signal lines 230 may exchange electrical signals with the stacked NAND cell array 250. For example, the signal lines 230 may include at least one bit line, a plurality of string selection lines, a plurality of word lines, at least one ground selection line, and/or at least one common source line, which will be described later.

If the signal lines 230 are arranged under the stacked NAND cell array 250, a connection between the stacked NAND cell array 250 and the signal lines 230 may be simplified. For example, the stacked NAND cell array 250 may be connected to the signal lines 230 under the stacked NAND cell array 250 via a plurality of vertical plugs 240. In this structure, the signal lines 230 do not require an additional space on the substrate 210 and the stacked NAND cell array 250 may not become lager in order to arrange the signal lines 230 thereon. Thus, the non-volatile memory device may be highly integrated.

Alternatively, the signal lines 230 may be arranged on the stacked NAND cell array 250. In example embodiments, the vertical plugs 240 may extend upward from the stacked NAND cell array 250 and the signal lines 230 may be arranged on the vertical plugs 240.

Alternatively, the signal lines 230 may be divided and separately arranged on and under the stacked NAND cell array 250. In this case, the signal lines 230 may be connected on and under the vertical plugs 240.

Figure 2:
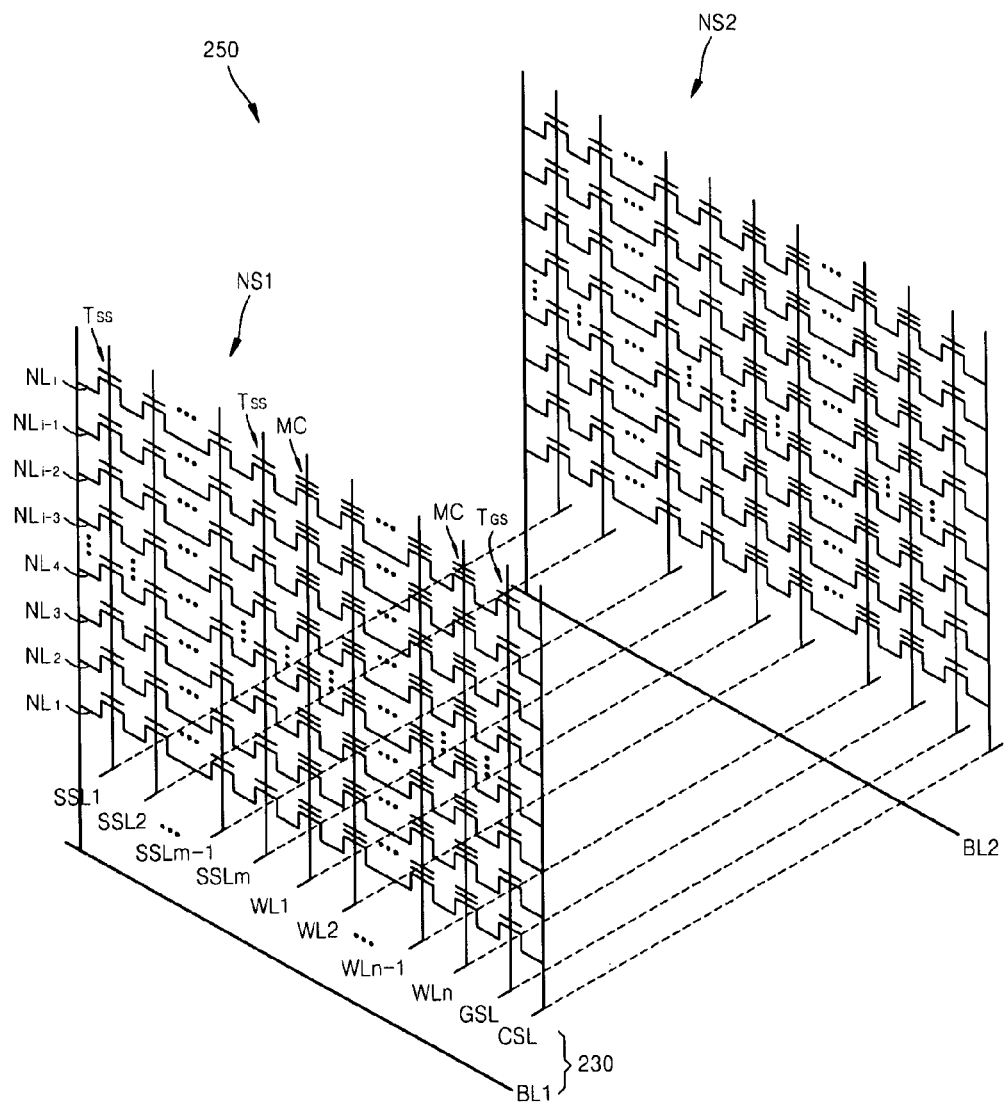

FIG. 2 is a circuit diagram of a non-volatile memory device according to example embodiments. The non-volatile memory device according to example embodiments shows in more detail some elements of the non-volatile memory device illustrated in FIG. 1. FIG. 2 will be described in conjunction with FIG. 1.

Referring to FIG. 2, arrangement of and connection between the stacked NAND cell array 250 and the signal lines 230 which may be arranged on the substrate 210 will be described. For example, the signal lines 230 may include first and second bit lines BL1 and BL2, first through mth string selection lines SSL1 through SSLm, first through nth word lines WL1 through WLn, a ground selection line GSL, and a common source line CSL.

For example, the signal lines 230 may be arranged under the stacked NAND cell array 250. The first and second bit lines BL1 and BL2 may be arranged at a bottom portion of the signal lines 230 and the first through mth string selection lines SSL1 through SSLm, the first through nth word lines WL1 through WLn, the ground selection line GSL, and the common source line CSL may be arranged between the stacked NAND cell array 250 and the first and second bit lines BL1 and BL2.

The stacked NAND cell array 250 may include at least one NAND set having a vertically stacked structure, e.g., a first NAND set NS1 and a second NAND set NS2. The first and second NAND sets NS1 and NS2 may be arranged in a row on the substrate 210. The stacked NAND cell array 250 may further include a plurality of NAND sets (not shown) and the NAND sets may be arranged on the substrate 210 in a matrix shape.

Each of the first and second NAND sets NS1 and NS2 may include a plurality of NAND strings, e.g., first through ith NAND strings NL1 through NLi that may be vertically stacked on the substrate 210. The stacked NAND cell array 250 may increase memory capacity due to the increased number of the vertically stacked NAND strings. Thus, the non-volatile memory device according to example embodiments may be highly integrated.

The first through ith NAND strings NL1 through NLi may have substantially the same structure and may separately extend in a direction substantially parallel to the substrate 210. For example, each NAND string NLj may include a plurality of string selection transistors TSS, a plurality of memory cells MC, and at least one ground selection transistor TGS, which may be arranged in the same layer. The string selection transistors TSS and the ground selection transistor TGS may be arranged opposite to each other with respect to the memory cells MC.

The first bit line BL1 may be commonly connected to ends of the first through ith NAND strings NL1 through NLi of the first NAND set NS1 and the second bit line BL2 may be commonly connected to ends of the first through ith NAND strings NL1 through NLi of the second NAND set NS2. The common source line CSL may be commonly connected to other ends of the first through ith NAND strings NL1 through NLi of the first and second NAND sets NS1 and NS2 and may further be connected to a body of the memory cells MC. Because each bit line BLj is shared by each NAND set NSj in this structure, the number of bit lines, for example, the first and second bit lines BL1 and BL2, may be greatly reduced and the structure may be simplified in comparison to the conventional art.

The first and second bit lines BL1 and BL2 may extend in a direction substantially parallel to a direction in which the first through ith NAND strings NL1 through NLi extend and the common source line CSL may extend in a direction substantially perpendicular to the direction in which the first through ith NAND strings NL1 through NLi extend. The common source line CSL may be provided on the first and second bit lines BL1 and BL2.

The first through nth word lines WL1 through WLn may be provided to control operation of the memory cells MC. The first through nth word lines WL1 through WLn may be commonly coupled with the first through ith NAND strings NL1 through NLi. For example, the first through nth word lines WL1 through WLn may be commonly coupled with the memory cells MC of the first and second NAND sets NS1 and NS2. For example, each word line WLj may be commonly connected to control gates of corresponding memory cells MC stacked on the word line WLj.

The first through mth string selection lines SSL1 through SSLm may be provided to control signal transmission between the first and second bit lines BL1 and BL2 and the memory cells MC. For example, the first through mth string selection lines SSL1 through SSLm may provide a muxing structure for connecting a signal of each bit line BLj to a selected NAND string NLj of the corresponding NAND set NSj. The number (m) of string selection lines, for example, the first through mth string selection lines SSL1 through SSLm, may be equal to or less than the number (i) of NAND strings, for example, the first through ith NAND strings NL1 through NLi.

The first through mth string selection lines SSL1 through SSLm may be commonly coupled with the first through ith NAND strings NL1 through NLi. For example, the first through mth string selection lines SSL1 through SSLm may be commonly coupled with the string selection transistors TSS of the first and second NAND sets NS1 and NS2. For example, each string selection line SSLj may be commonly connected to gates of the string selection transistors TSS stacked on the string selection line SSLj.

At least one ground selection line GSL may be provided to control a signal connection between the memory cells MC and the common source line CSL. The ground selection line GSL may be commonly coupled with the first through ith NAND strings NL1 through NLi. For example, the ground selection line GSL may be commonly connected to gates of ground selection transistors TGS of the first and second NAND sets NS1 and NS2. The first through mth string selection lines SSL1 through SSLm, the first through nth word lines WL1 through WLn, and the ground selection line GSL may extend in a direction substantially perpendicular to the direction in which the first through ith NAND strings NL1 through NLi extend and may be provided on the first and second bit lines BL1 and BL2.

Alternatively, the signal lines 230 may be arranged on the stacked NAND cell array 250. For example, the first and second bit lines BL1 and BL2 may be arranged on a top portion of the signal lines 230, and the first through mth string selection lines SSL1 through SSLm, the first through nth word lines WL1 through WLn, the ground selection line GSL, and the common source line CSL may be arranged between the stacked NAND cell array 250 and the first and second bit lines BL1 and BL2.

Alternatively, the signal lines 230 may be divided and separately arranged on and under the stacked NAND cell array 250. For example, at least one of the first and second bit lines BL1 and BL2, the first through mth string selection lines SSL1 through SSLm, the first through nth word lines WL1 through WLn, the ground selection line GSL, and the common source line CSL may be arranged under the stacked NAND cell array 250 and the other may be arranged on the stacked NAND cell array 250.

Figure 3:
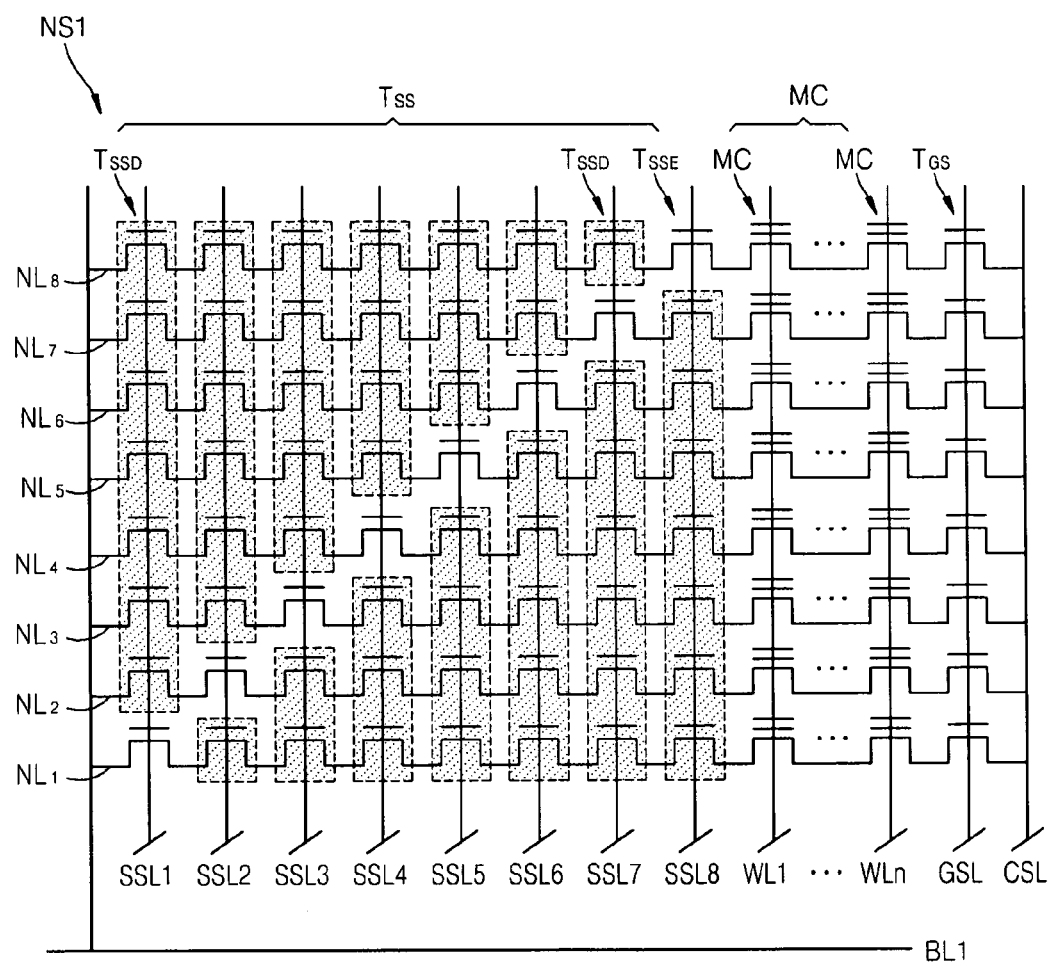
Figure 4:
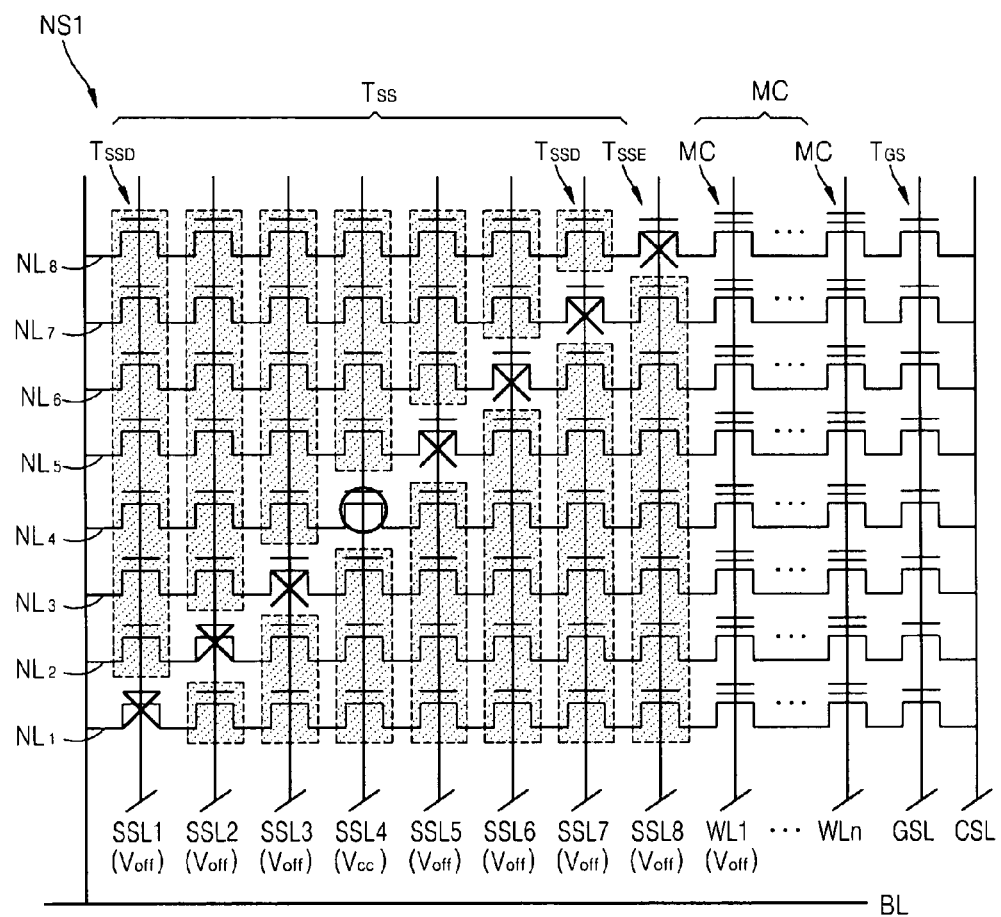

FIG. 3 is a circuit diagram of a non-volatile memory device according to example embodiments. FIG. 4 is a circuit diagram for describing a method of selecting NAND strings in the non-volatile memory device illustrated in FIG. 3. The non-volatile memory device according to example embodiments may be provided as an example of the non-volatile memory device illustrated in FIG. 2. Thus, FIG. 3 will be described in conjunction with FIG. 2 and detailed descriptions thereof will be omitted.

Referring to FIG. 3, for similarity, only the first NAND set NS1 and the signal lines 230 are illustrated. Eight NAND strings, i.e., first through eighth NAND strings NL1 through NL8, are exemplarily illustrated. However, the current embodiment is not limited to this number of NAND strings.

The number of NAND strings, for example, the first through eighth NAND strings NL1 through NL8, may be equal to the number of string selection lines. For example, the string selection lines may include first through eighth string selection lines SSL1 through SSL8. The string selection transistors TSS in each NAND string NLj may include at least one enhancement-mode string selection transistor TSSE and at least one depletion-mode string selection transistor TSSD. For example, the string selection transistors TSS in each NAND string NLj may include one enhancement-mode string selection transistor TSSE and the other (seven) depletion-mode string selection transistors TSSD (surrounded by dotted lines).

Enhancement-mode string selection transistors TSSE may be coupled with the first through eighth string selection lines SSL1 through SSL8 in one-to-one correspondence. For example, the enhancement-mode string selection transistors TSSE may be arranged in a diagonal line with respect to arrangement of the entire string selection transistors TSS.

The enhancement-mode string selection transistors TSSE may be normally in an off state and may be changed into an on state if a turn-on voltage is applied to a corresponding string selection line SSLj. For example, if the enhancement-mode string selection transistors TSSE are n-channel metal oxide semiconductors (NMOSs), the turn-on voltage may have a positive value. The depletion-mode string selection transistors TSSD may be normally in an on state and may be converted into an off state if a turn-off voltage is applied to a corresponding string selection line SSLj. For example, if the depletion-mode string selection transistors TSSD are NMOSs, the turn-off voltage may have a negative value.

Thus, in order to access the memory cells MC in each NAND string NLj, the turn-on voltage may be applied to a corresponding string selection line SSLj coupled with a corresponding enhancement-mode string selection transistor TSSE and the turn-off voltage (0V) may be applied to the other string selection lines.

For example, as shown in FIG. 4, in order to electrically connect the first bit line BL1 to the memory cells MC in the fourth NAND string NL4, a turn-on voltage Vcc may be applied to a corresponding string selection line, for example, the fourth string selection line SSL4 and a turn-off voltage Voff, e.g., 0V, may be applied to the other string selection lines, i.e., the first through third and fifth through eighth string selection lines SSL1 through SSL3 and SSL5 through SSL8. In FIG. 4, "O" represents an on state and "X" represents an off state. In this case, electrical connection is blocked between the first bit line BL1 and the other NAND strings, for example, the first through third and fifth through eighth NAND strings NL1 through NL3 and NL5 through NL8.

Figure 5:
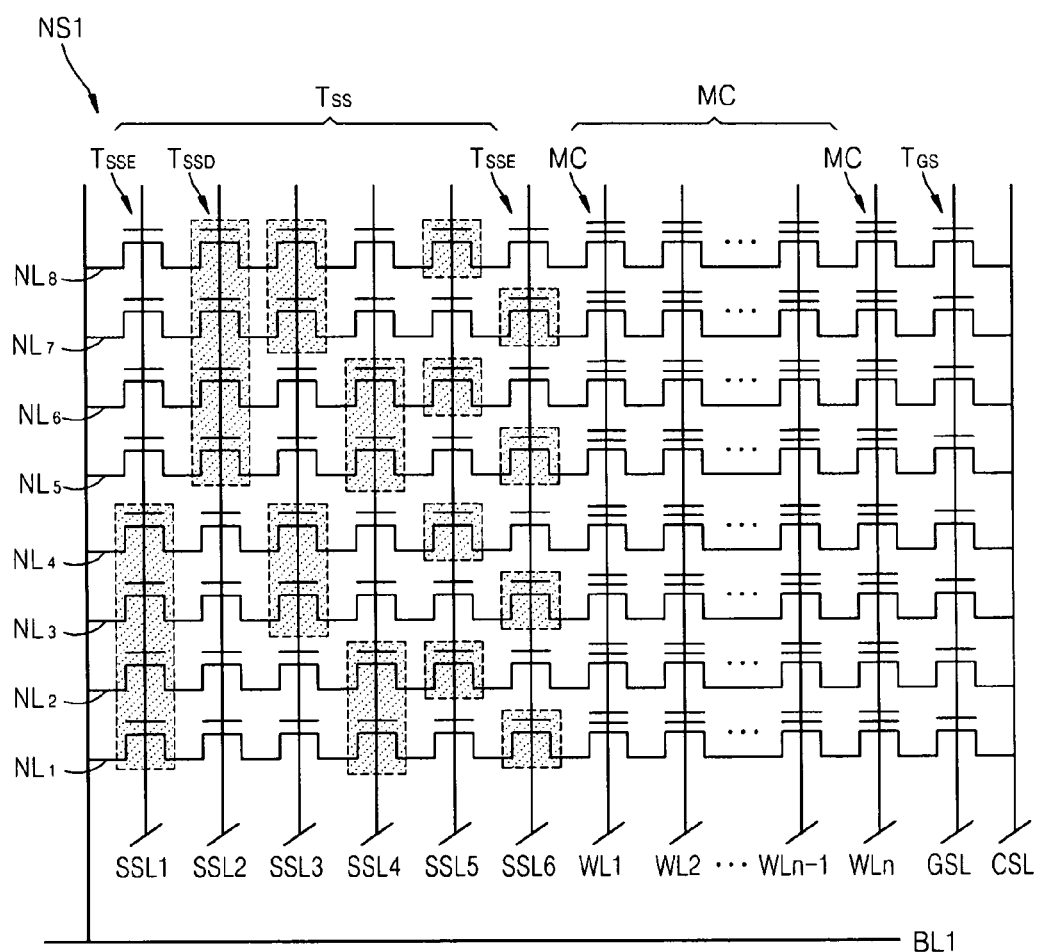
Figure 6:
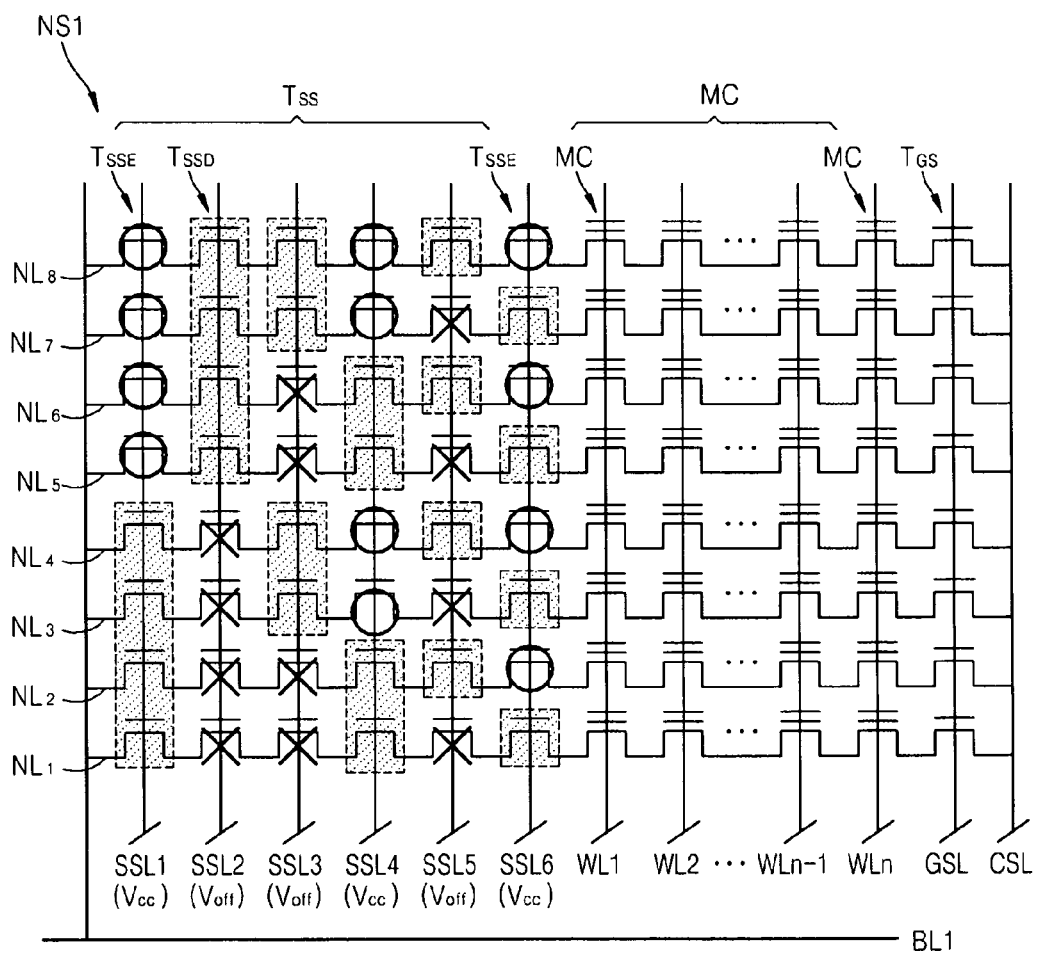
Figure 7:
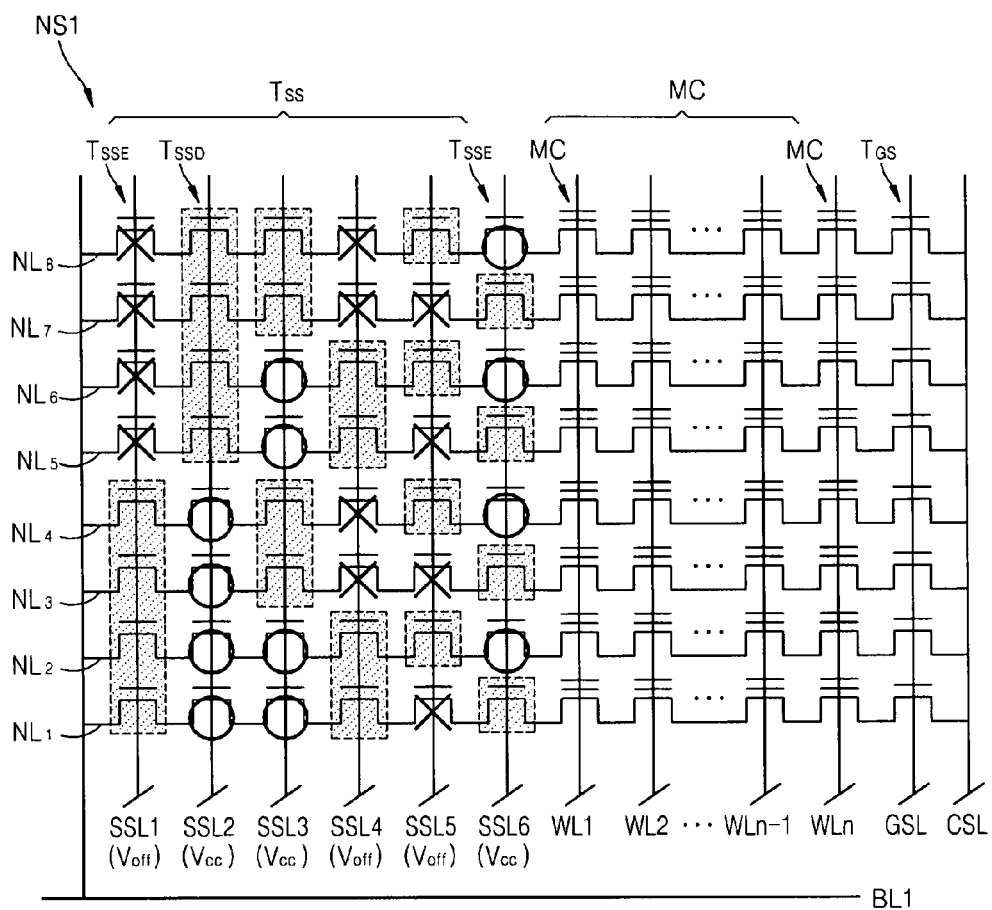

FIG. 5 is a circuit diagram of a non-volatile memory device according to example embodiments. FIGS. 6 and 7 are circuit diagrams for describing a method of selecting NAND strings in the non-volatile memory device illustrated in FIG. 5. The non-volatile memory device illustrated in FIGS. 4, 6, and 7 may be provided as another example of the non-volatile memory device illustrated in FIG. 2 and as a modified example of the non-volatile memory device illustrated in FIG. 3. Thus, FIGS. 5, 6, and 7 will be described in conjunction with FIGS. 2 and 3 and repeated descriptions thereof will be omitted.

Referring to FIG. 5, the number of string selection lines, for example, first through sixth string selection lines SSL1 through SSL6, may be less than the number of NAND strings, for example, the first through eighth NAND strings NL1 through NL8. In FIG. 5, the number of NAND strings is 8 ($8=2^3$) and the number of string selection lines is 6 ($2\times3$). The first through sixth string selection lines SSL1 through SSL6 of each NAND string NLj may include three enhancement-mode string selection transistors TSSE and three depletion-mode string selection transistors TSSD. Each string selection line SSLj may be coupled with four 4 ($2^{3-1}$) enhancement-mode string selection transistors TSSE and the other (four) depletion-mode string selection transistors TSSD.

In more detail, if the number of NAND strings is $2^k$, the number of string selection lines is m (m=2×k). The string selection lines of each NAND string may include k enhancement-mode string selection transistors TSSE and the other (k) depletion-mode string selection transistors TSSD. Each string selection line may be coupled with $2^{k-1}$ enhancement-mode string selection transistors TSSE and the other ($2^{k-1}$) depletion-mode string selection transistors TSSD.

As shown in FIG. 5, the enhancement-mode string selection transistors TSSE and the depletion-mode string selection transistors TSSD in the first NAND set NS1 may be arranged to sequentially divide the first through eighth NAND strings NL1 through NL8 into two groups. In this arrangement, one corresponding NAND string may be accessed by applying a turn-on voltage to three of the first through sixth string selection lines SSL1 through SSL6 and applying a turn-off voltage (0V) to the others.

For example, as shown in FIG. 6, the eighth NAND string NL8 may be electrically connected to the first bit line BL1 by applying a turn-on voltage Vcc to the first, fourth, and sixth string selection lines SSL1, SSL4, and SSL6 and applying a turn-off voltage Voff, e.g., 0V to the second, third, and fifth string selection lines SSL2, SSL3, and SSL5. In this case, electrical connection may be blocked between the first bit line BL1 and the first through seventh NAND strings NL1 through NL7.

Alternatively, as shown in FIG. 7, the second NAND string NL2 may be electrically connected to the first bit line BL1 by applying the turn-on voltage Vcc to the second, third, and six string selection lines SSL2, SSL3, and SSL6 and by applying the turn-off voltage Voff, e.g., 0V to the first, fourth, and fifth string selection lines SSL1, SSL4, and SSL5. In this case, an electrical connection may be blocked between the first bit line BL1 and the first and third through eighth NAND strings NL1 and NL3 through NL8.

If a case when the turn-on voltage Vcc is applied to each string selection line SSLj is represented as "1" and a case when the turn-off voltage Voff, e.g., 0V, is applied to each string selection line SSLj is represented as "0", an operation condition for connecting each NAND string NLj to the first bit line BL1 is as described below. A [100101] voltage condition for selecting the eighth NAND string NL8, a [100110] voltage condition for selecting the seventh NAND string NL7, a [101001] voltage condition for selecting the sixth NAND string NL6, a [101010] voltage condition for selecting the fifth NAND string NL5, a [010101] voltage condition for selecting the fourth NAND string NL4, a [010110] voltage condition for selecting the third NAND string NL3, a [011001] voltage condition for selecting the second NAND string NL2, and a [011010] voltage condition for selecting the first NAND string NL1 may be applied to the first through sixth string selection lines SSL1 through SSL6.

Figure 8:
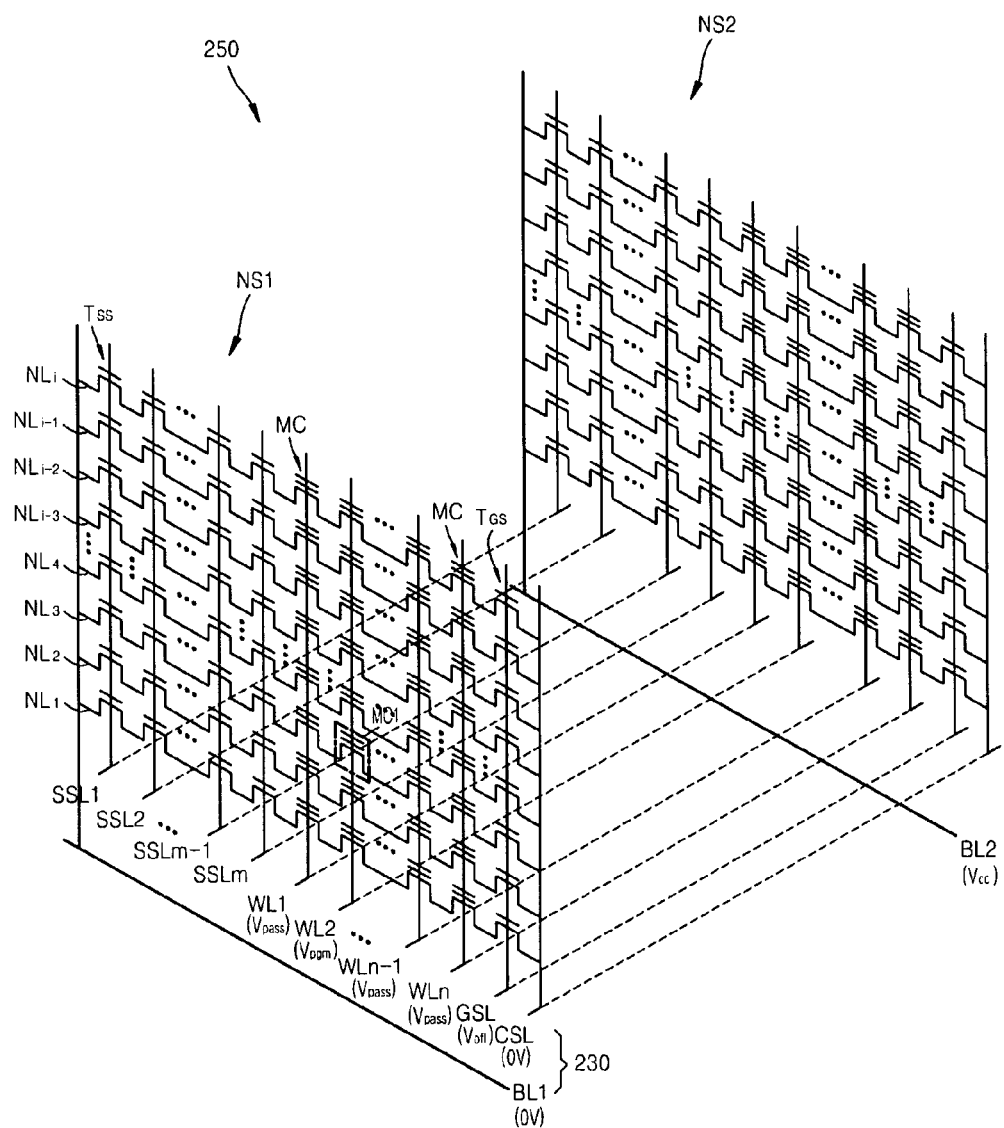
Figure 9:
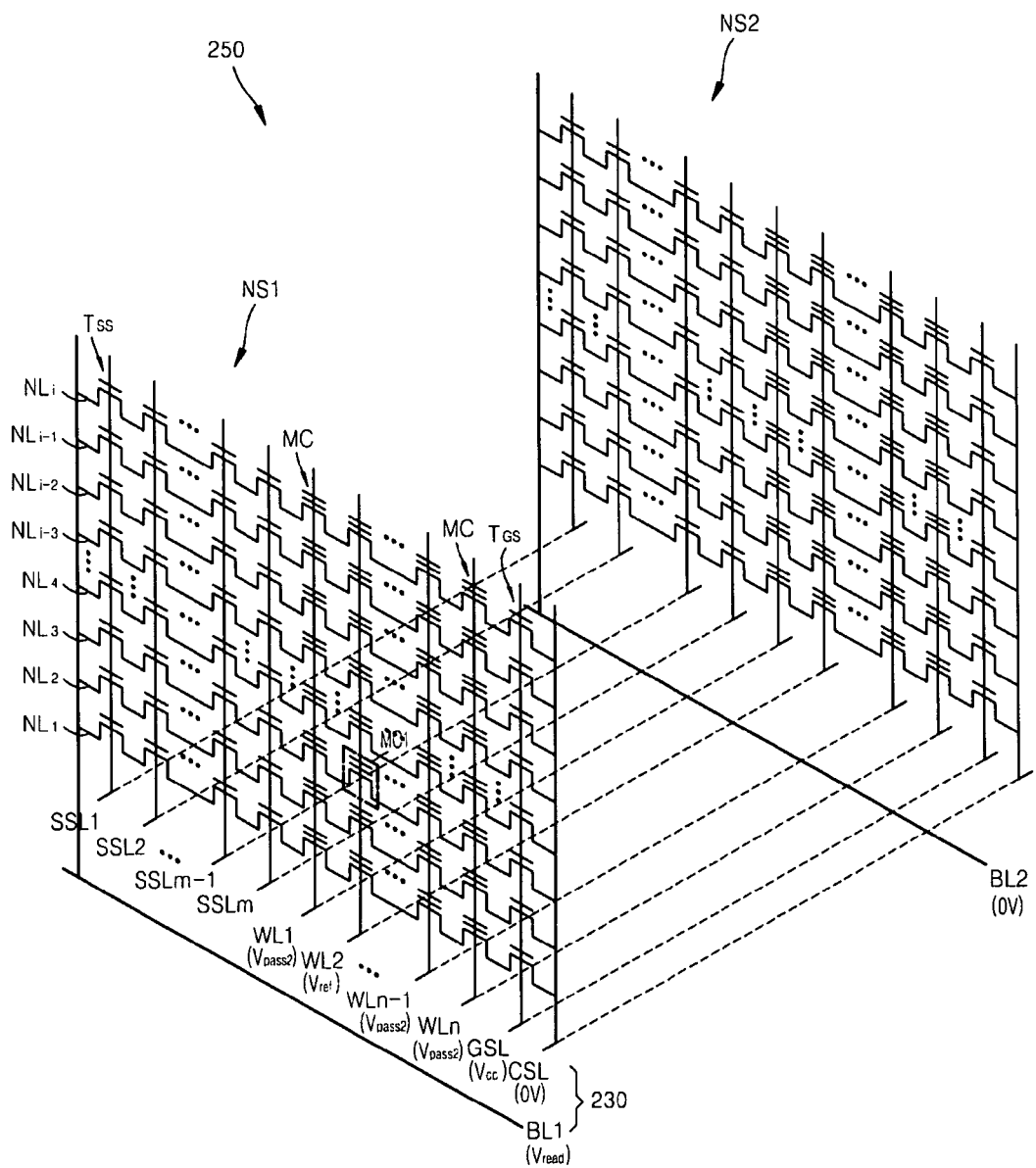

Table 1 shows operation conditions of the non-volatile memory device illustrated in FIG. 2. FIGS. 8 and 9 are circuit diagrams for describing a method of operating the non-volatile memory device illustrated in FIG. 2.

TABLE 1

|  | Program | Read | Erase |
|---|---|---|---|
| SEL_BL | 0 V | $V_{read}$ | FT |
| USL_BL | $V_{cc}$ | FT | FT |
| SSL | Combination of $V_{cc}/V_{off}$ | | FT |
| SEL_WL | $V_{pgm}$ | $V_{ref}$ | 0 V |
| USL_WL | $V_{pass}$ | $V_{pass2}$ | 0 V |
| GSL | $V_{off}$ | $V_{cc}$ | FT |
| CSL/BD | 0 V | 0 V | $V_{ers}$ |

A selected bit line SEL_BL may represent at least one selected from among the first and second bit lines BL1 and BL2 and an unselected bit line USL_BL may represent the other bit line. A selected word line SEL_WL may represent at least one selected from among the first through nth word lines WL1 through WLn and an unselected word line USL_WL may represent each of the other word lines.

In a program operation, 0V may be applied to the selected bit line SEL_BL, the turn-on voltage Vcc may be applied to the unselected bit line USL_BL for channel boosting, a program voltage Vpgm may be applied to the selected word line SEL_WL, a pass voltage Vpass may be applied to the unselected word line USL_WL, and 0V may be applied to the body of a memory cell MC through the common source line CSL. As described above with reference to FIGS. 6 and 7, an appropriate combination of the turn-on voltage Vcc and the turn-off voltage Voff may be applied to the first through mth string selection lines SSL1 through SSLm in order to select a corresponding NAND string NLi. The turn-off voltage Voff may be applied to the ground selection line GSL. For example, the pass voltage Vpass may be greater than a threshold voltage of the memory cells MC and the program voltage Vpgm may be greater than the pass voltage Vpass.

For example, as shown in FIG. 8, in order to program data in a selected memory cell MC1, the program voltage Vpgm may be applied to a selected word line, for example, the second word line WL2, and the pass voltage Vpass may be applied to unselected word lines, for example, the first and third through nth word lines WL1 and WL3 through WLn. As described above with reference to FIG. 7, the [010110] voltage condition may be applied to the first through mth string selection lines SSL1 through SSLm in order to electrically connect the first bit line BL1 to the third NAND string NL3. In this case, charges may be injected into the selected memory cell MC1 by using a Fowler-Nordheim (F-N) tunneling effect and charge injection to the other memory cells MC may be blocked due to channel boosting.

In a read operation, the read voltage Vread may be applied to the selected bit line SEL_BL, the reference voltage Vref may be applied to the selected word line SEL_WL, a second pass voltage Vpass2 may be applied to the unselected word line USL_WL, and 0V may be applied to the body of a memory cell MC through the common source line CSL. As described above with reference to FIGS. 6 and 7, an appropriate combination of the turn-on voltage Vcc and the turn-off voltage Voff may be applied to the first through mth string selection lines SSL1 through SSLm in order to select a corresponding NAND string NLi. The turn-on voltage Vcc may be applied to the ground selection line GSL. The second pass voltage Vpass2 may be equal to or greater than the threshold voltage of the memory cells MC and may be less than the pass voltage Vpass.

For example, as shown in FIG. 9, in order to read data state of the selected memory cell MC1, the reference voltage Vref may be applied to the selected word line, for example, the second word line WL2, and the second pass voltage Vpass2 may be applied to the unselected word lines, for example, the first and third through nth word lines WL1 and WL3 through WLn. As described above with reference to FIG. 7, the [010110] voltage condition may be applied to the first through mth string selection lines SSL1 through SSLm in order to electrically connect the first bit line BL1 to the third NAND string NL3. In this case, the selected memory cell MC1 may be turned on or off according to the data state thereof. Thus, the data state of the selected memory cell MC1 may be read by measuring a current via the third NAND string NL3.

In an erase operation, in a state when 0V is applied to the selected word line SEL_WL and the unselected word line USL_WL, an erase voltage Vers may be applied to a body BD of the memory cells MC. In the erase operation, the selected bit line SEL_BL, the unselected bit line USL_BL, the string selection line SSL, and the ground selection line GSL are floated. For example, if the common source line CSL is coupled with the body BD, the erase voltage Vers may be applied to the body BD of the memory cells MC through the common source line CSL. As such, charges stored in the entire memory cells MC may be simultaneously erased due to an F-N tunneling effect.

Figure 10:
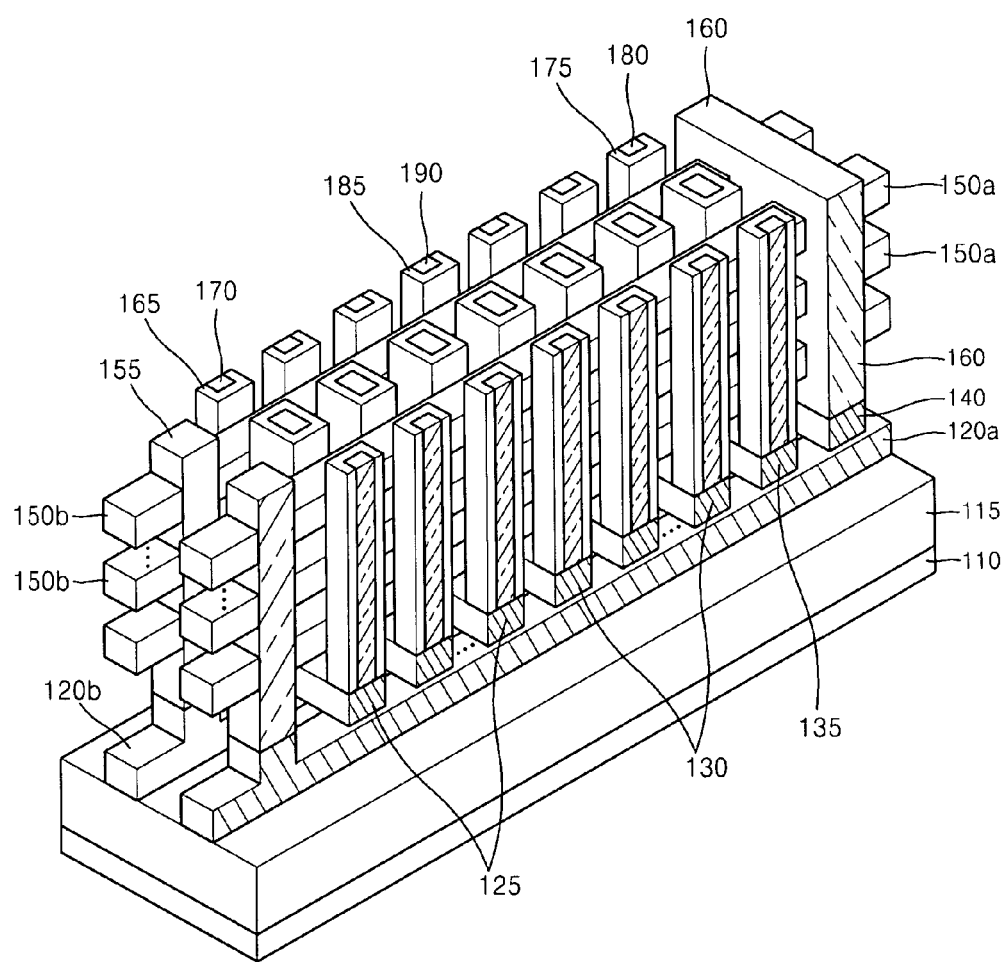
Figure 11:
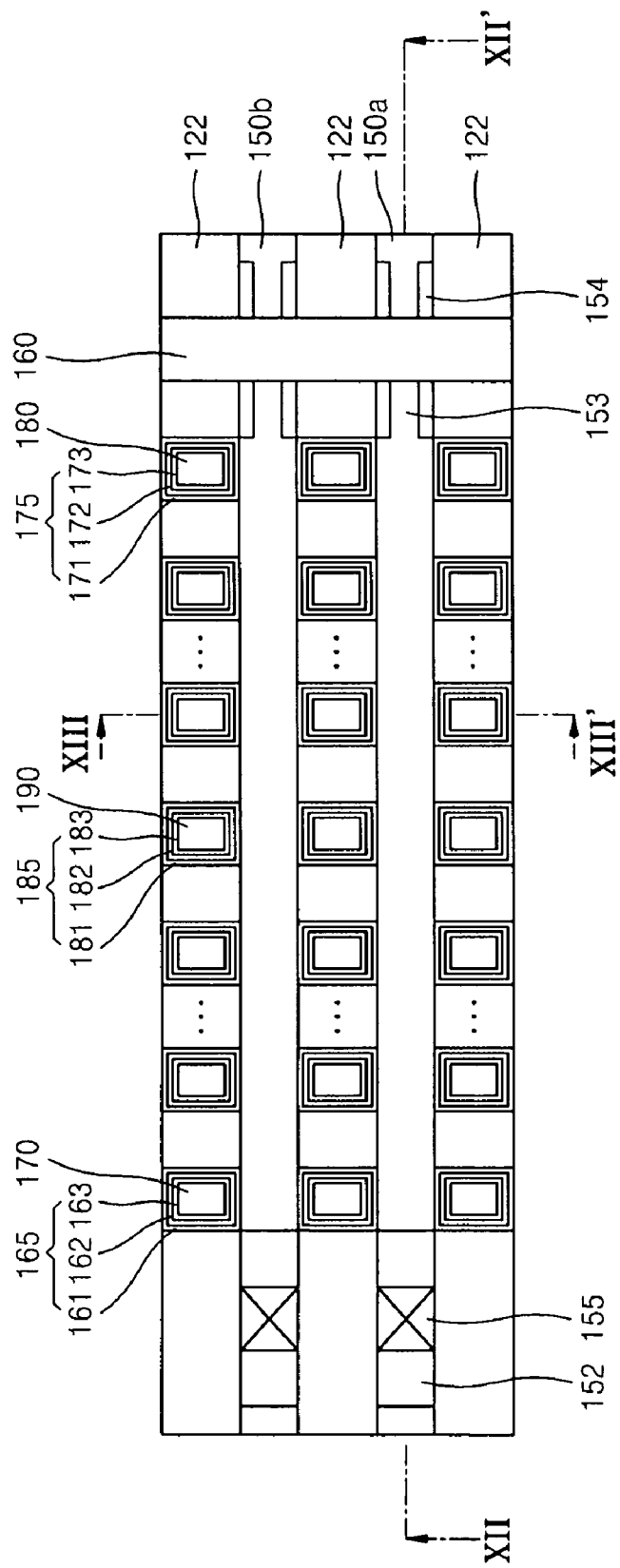
Figure 12:
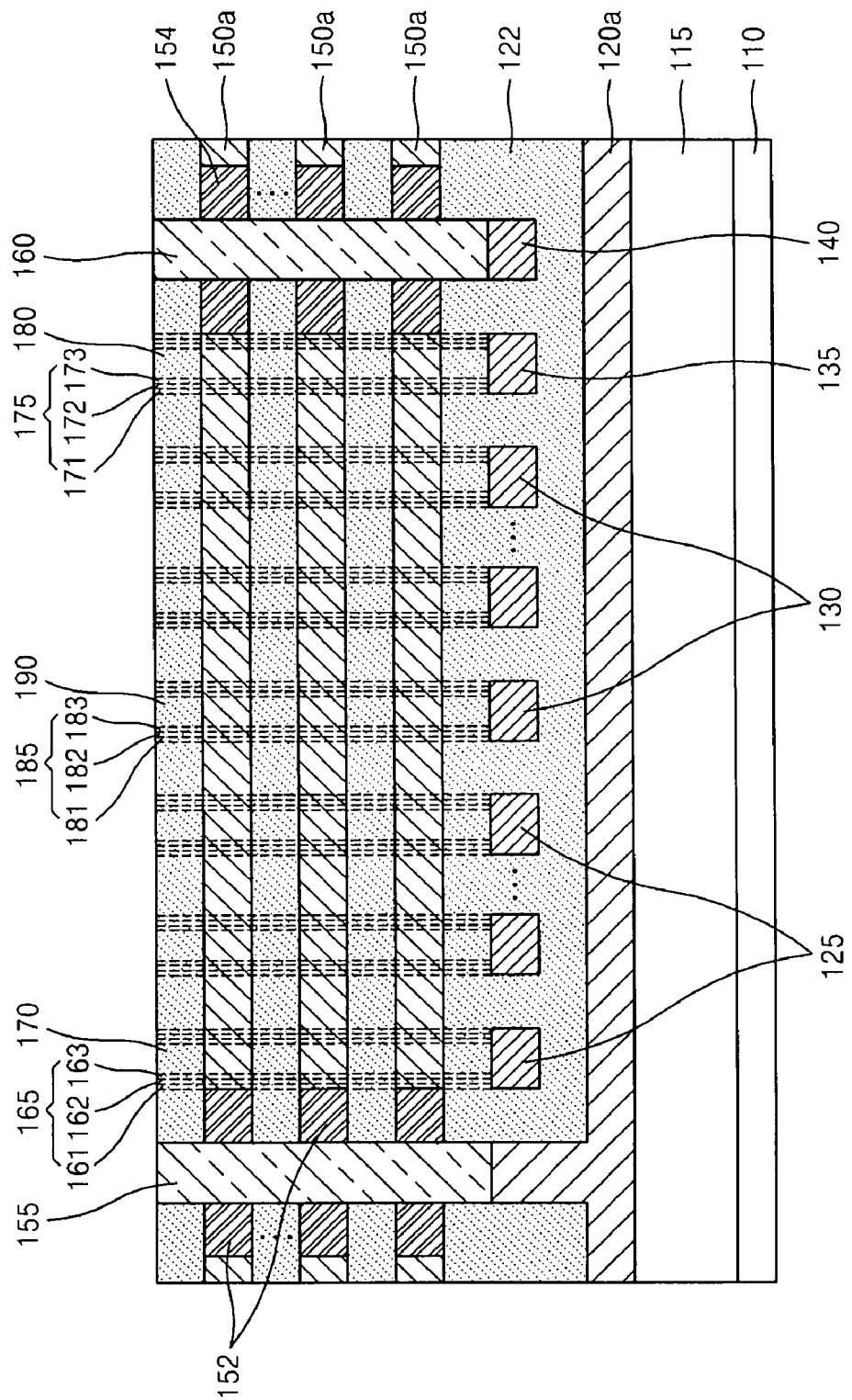
Figure 13:
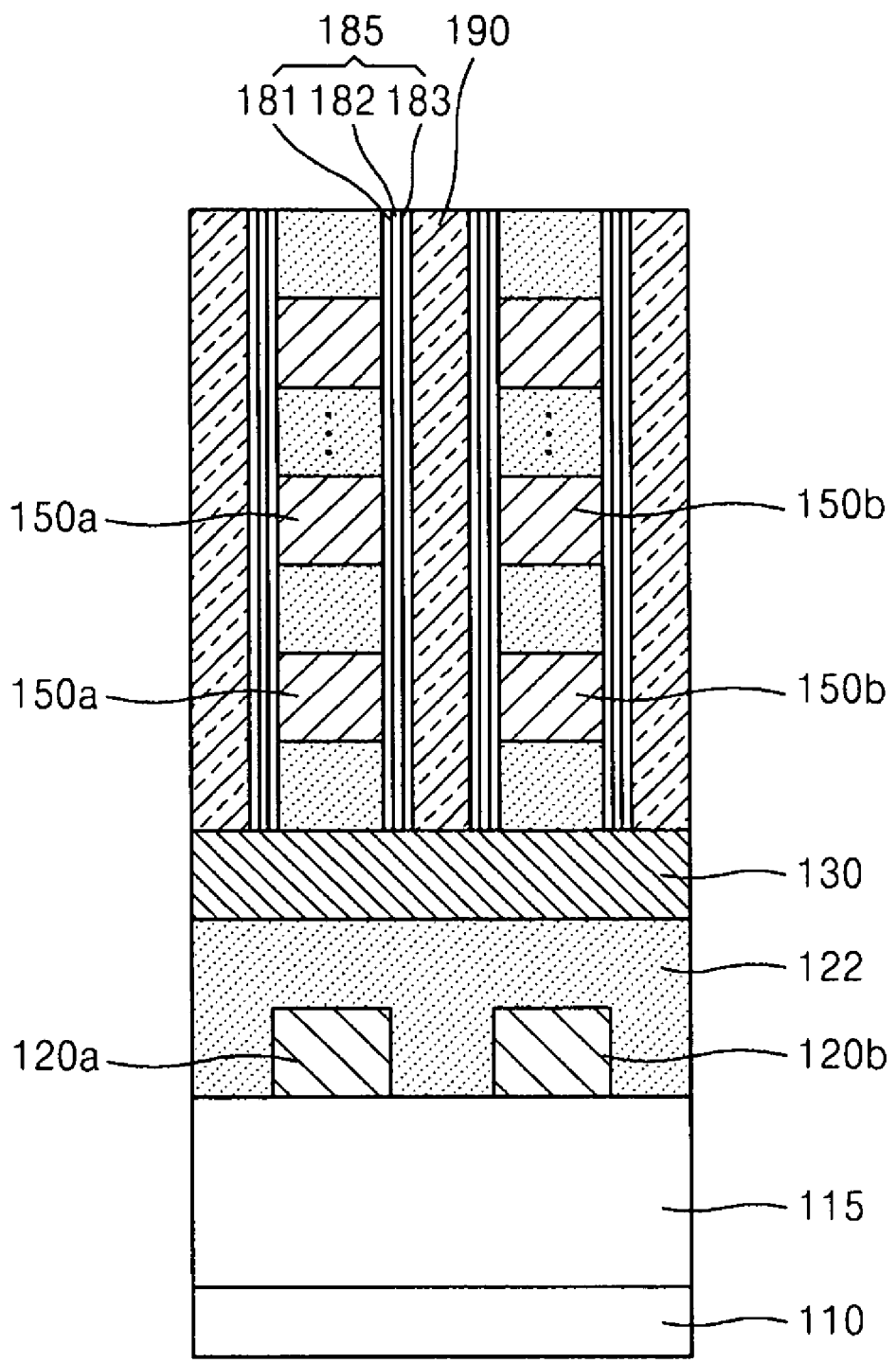

FIG. 10 is a perspective view of a non-volatile memory device according to example embodiments. FIG. 11 is a plan view of the example non-volatile memory device illustrated in FIG. 10. FIG. 12 is a cross-sectional view taken along a line XII-XII' of the non-volatile memory device illustrated in FIG. 11. FIG. 13 is a cross-sectional view taken along a line XIII-XIII' of the non-volatile memory device illustrated in FIG. 11.

Referring to FIGS. 10 through 13, a first set of semiconductor layers 150*a* and a second set of semiconductor layers 150*b* may be vertically stacked on a substrate 110. The number of the semiconductor layers 150*a* and 150*b* may be appropriately selected according to capacity of the non-volatile memory device and the current embodiment is not limited by the number of the semiconductor layers 150*a* and 150*b*. The semiconductor layers 150*a* and 150*b* may include drain regions 152, source regions 154, and body regions 153. For example, each of the semiconductor layers 150*a* and 150*b* may include a drain region 152 at one end and a source region 154 at the other end, and may include a body region 153 around the drain region 152 and the source region 154. The drain regions 152 and the source regions 154 may form PN junction with the body regions 153.

A first bit line 120*a* may be commonly connected to one end of the first set of semiconductor layers 150*a* and a second bit line 120*b* may be commonly connected to one end of the second set of semiconductor layers 150*b*. For example, the first bit line 120*a* may be provided under the first set of semiconductor layers 150*a* and on an insulating layer 115 on the substrate 110 and the second bit line 120*b* may be provided under the second set of semiconductor layers 150*b* and on the substrate 110. The first and second bit lines 120*a* and 120*b* may correspond to the first and second bit lines BL1 and BL2 illustrated in FIG. 1.

The first bit line 120*a* may be commonly connected to the drain regions 152 of the first set of semiconductor layers 150*a* via first contact plugs 155 and the second bit line 120*b* may be commonly connected to the drain regions 152 of the second set of semiconductor layers 150*b* via the first contact plugs 155. The first contact plugs 155 may penetrate through the first set of semiconductor layers 150*a* and/or the second set of semiconductor layers 150*b* and may perpendicularly extend on the substrate 110. The first contact plugs 155 may directly contact the drain region 152 of the first set of semiconductor layers 150*a* and/or the second set of semiconductor layers 150*b*.

At least one common source line 140 may be commonly connected to the semiconductor layers 150*a* and 150*b*. For example, the common source line 140 may be provided under the semiconductor layers 150*a* and 150*b* and on the first and second bit lines 120*a* and 120*b*. The common source line 140 may be commonly connected to the source regions 154 and the body regions 153 of the semiconductor layers 150*a* and 150*b* via second contact plugs 160. For example, the second contact plugs 160 may penetrate through the semiconductor layers 150*a* and 150*b* and may perpendicularly extend on the substrate 110, thereby contacting the source regions 154 and the body regions 153. The second contact plugs 160 may perpendicularly extend on the substrate 110 across the semiconductor layers 150*a* and 150*b*. The common source line 140 may correspond to the common source line illustrated in FIG. 1.

A plurality of string selection gate electrodes 170, at least one ground selection gate electrode 180, and a plurality of control gate electrodes 190 may be provided on side walls of the semiconductor layers 150*a* and 150*b* and may perpendicularly extend on the substrate 110. A plurality of string selection lines 125, a plurality of word lines 130, and at least one ground selection line 135 may be provided under the semiconductor layers 150*a* and 150*b* and on the first and second bit lines 120*a* and 120*b*. The string selection lines 125 may be connected to the string selection gate electrodes 170, the word lines 130 may be connected to the control gate electrodes 190, and the ground selection line 135 may be connected to the ground selection gate electrode 180.

A plurality of storage media 185 may be provided between the first set of semiconductor layers 150*a* and the control gate electrodes 190 and between the second set of semiconductor layers 150b and the control gate electrodes 190. For example, the storage media 185 may include a plurality of tunneling insulating layers 181 on the first and second set of the semiconductor layers 150a and 150b, a plurality of charge storage layers 182 on the tunneling insulating layers 181, and a plurality of blocking insulating layers 183 on the charge storage layers 182. The storage media 185 may be provided to surround the control gate electrodes 190.

The charge storage layers 182 may have capacity for storing charges. For example, the charge storage layers 182 may be a trap type and may include, for example, a silicon nitride layer, quantum dots, or nanocrystals. The quantum dots or the nanocrystals may be formed of fine particles of a conductive material such as a metal or a semiconductor. Alternatively, the charge storage layers 182 may be a floating type and may include a conductive material such as impurity-doped polysilicon.

A plurality of string selection gate insulating layers 165 may be provided between the first set of semiconductor layers 150a and the string selection gate electrodes 170 and between the second set of semiconductor layers 150b and the string selection gate electrodes 170. Similar to the storage media 185, each of the string selection gate insulating layers 165 may include a plurality of insulating layers 161 through 163. However, example embodiments are not limited thereto and each of the string selection gate insulating layers 165 may include one or two of the insulating layers 161 through 163.

A plurality of ground selection gate insulating layers 175 may be provided between the first set of semiconductor layers 150a and the ground selection gate electrodes 180 and between the second set of semiconductor layers 150b and the ground selection gate electrodes 180. Similar to the storage media 185, each of the ground selection gate insulating layers 175 may include a plurality of insulating layers 171 through 173. However, the current embodiment is not limited thereto and each of the ground selection gate insulating layers 175 may include one or two of the insulating layers 171 through 173.

According to example embodiments, a connection between the semiconductor layers 150a and 150b and signal lines, e.g., the first and second bit lines 120a and 120b, the string selection lines 125, the word lines 130, the ground selection line 135, and the common source line 140, may be simplified by using this perpendicular connection structure. Thus, because an additional wiring structure does not need to be arranged in order to couple the signal lines with the semiconductor layers 150a and 150b, the non-volatile memory device according to example embodiments may be highly integrated.

Alternatively, at least one of the signal lines, e.g., the first and second bit line 120a and 120b, the string selection lines 125, the word lines 130, the ground selection line 135, and the common source line 140 may be arranged on the semiconductor layers 150a and 150b.

Figure 14:
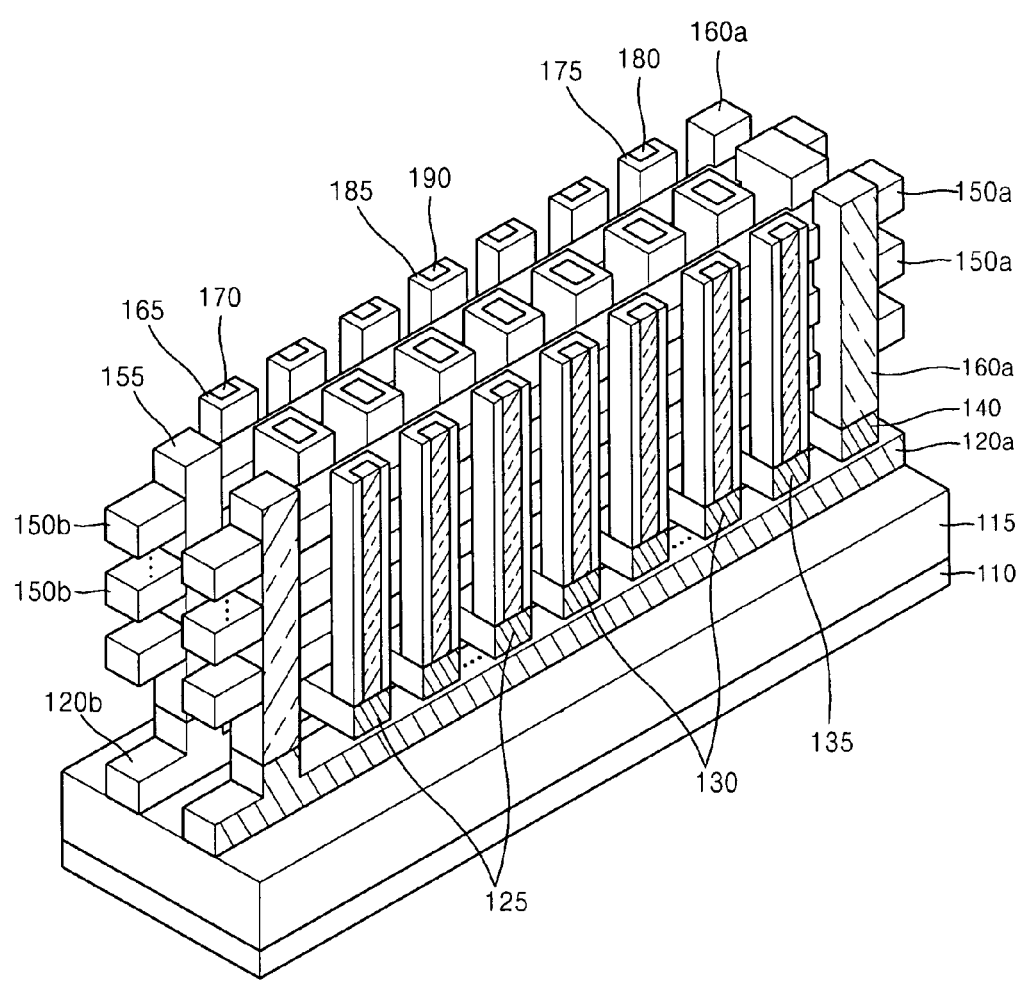
Figure 15:
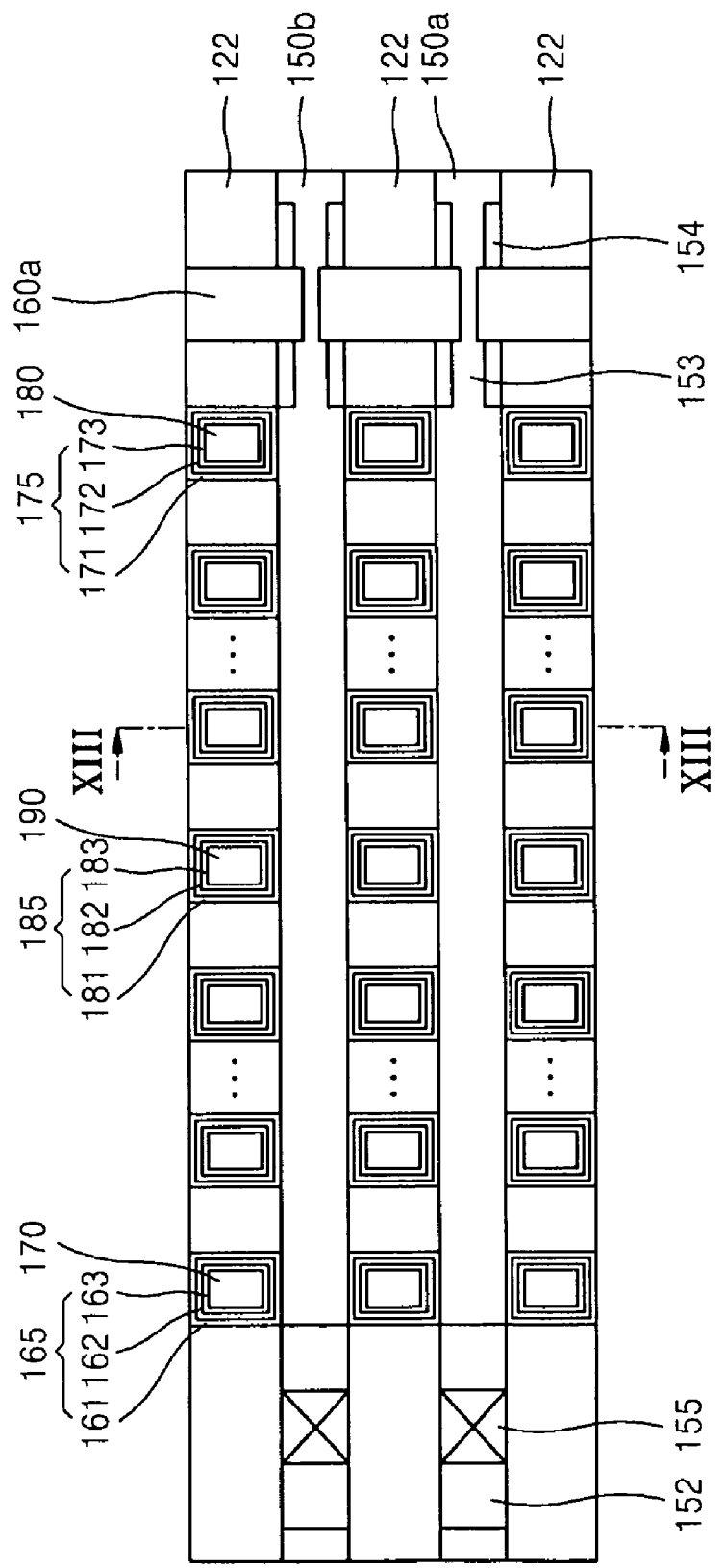

FIG. 14 is a circuit diagram of a non-volatile memory device according to example embodiments. FIG. 15 is a plan view of the non-volatile memory device illustrated in FIG. 14. The non-volatile memory device according to example embodiments may be similar to the non-volatile memory device illustrated in FIGS. 10 through 13 and repeated descriptions thereof will be omitted.

Referring to FIGS. 14 and 15, a common source line 140 may be commonly coupled with source regions 154 and body regions 153 of semiconductor layers 150a and 150b via a plurality of second contact plugs 160a. For example, the second contact plugs 160a may be arranged on one side surfaces of the semiconductor layers 150a and 150b and may perpendicularly extend on a substrate 110 across the semiconductor layers 150a and 150b. Side walls of the second contact plugs 160a may penetrate through the source regions 154 from the one side surfaces of the semiconductor layers 150a and 150b and may extend into the body regions 153. As such, the second contact plugs 160a may directly contact the source regions 154 and the body regions 153.

Figure 16:
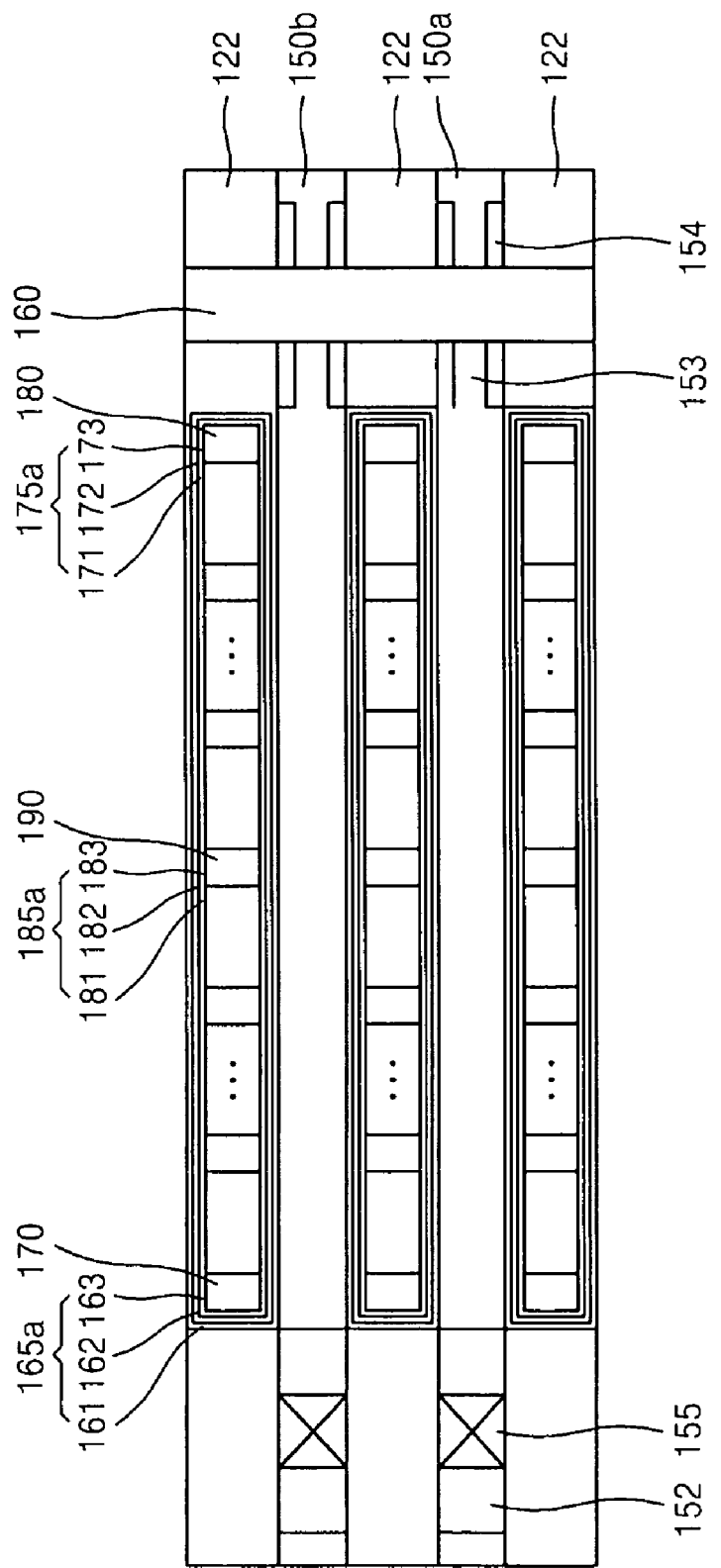

FIG. 16 is a plan view of a non-volatile memory device according to example embodiments. The non-volatile memory device according to example embodiments may be similar to the non-volatile memory device illustrated in FIGS. 10 through 13 and repeated descriptions thereof will be omitted.

Referring to FIG. 16, a plurality of storage media 185a may be provided in a line type so as to extend across control gate electrodes 190 between a first set of semiconductor layers 150a and the control gate electrodes 190 and between a second set of semiconductor layers 150b and the control gate electrodes 190. Accordingly, example embodiments provide for charge storage layers 182 that may be a trap type instead of a floating type.

A plurality of string selection gate insulating layers 165a and a plurality of ground selection gate insulating layers 175a may be provided to be connected to the storage media 185a. For example, a string selection gate insulating layer 165a, a storage medium 185a, and a ground selection gate insulating layer 175a, which may be arranged in the same line, may be connected to each other and may have a belt shape so as to surround the control gate electrodes 190 in a corresponding line. The string selection gate insulating layers 165a, the storage media 185a, and the ground selection gate insulating layers 175a may be integrally formed so as to fill trenches between the semiconductor layers 150a and 150b.

Figure 17:
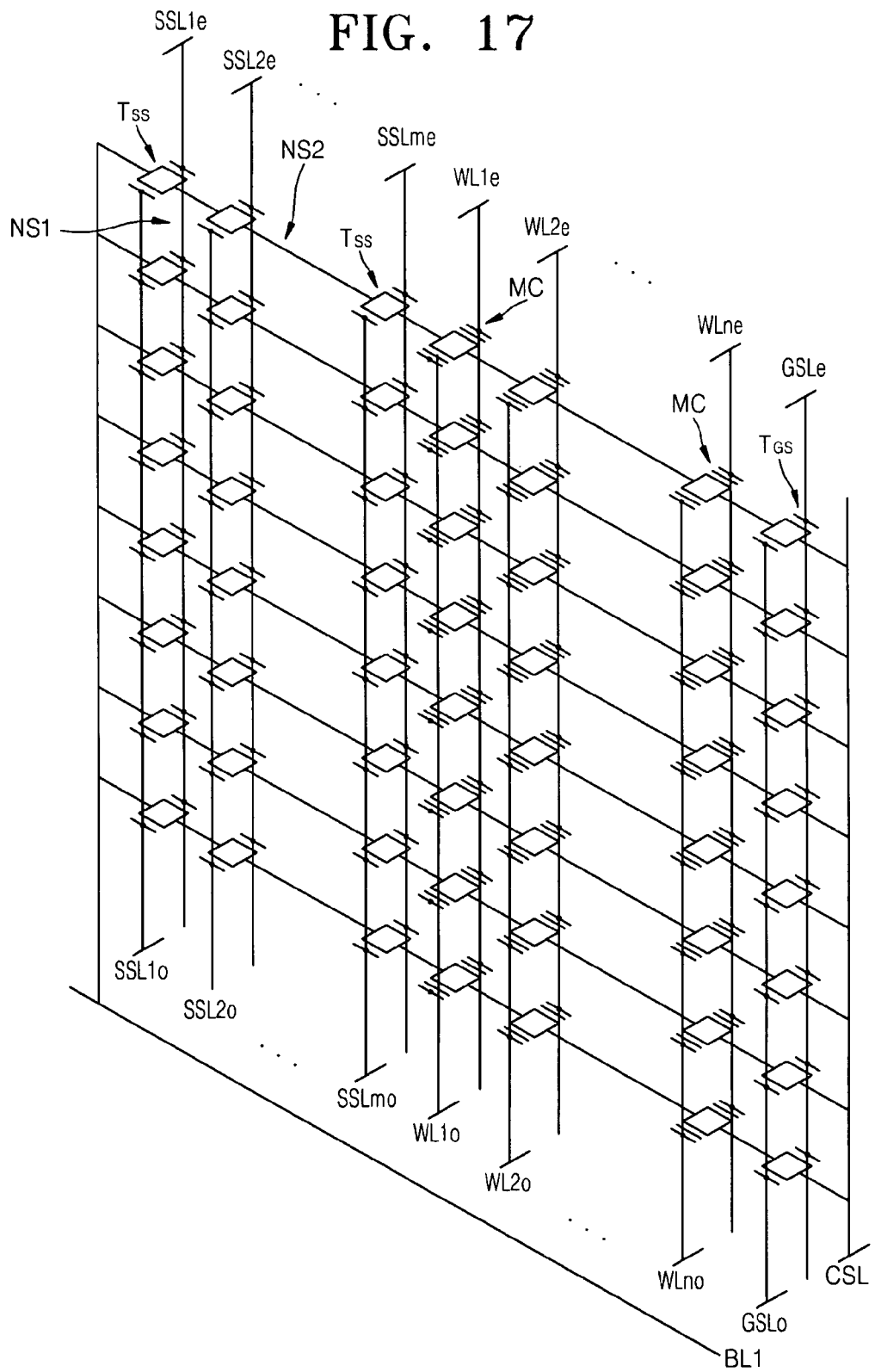

FIG. 17 is a circuit diagram of a non-volatile memory device according to another embodiment of the inventive concept. The non-volatile memory device according to the current embodiment may correspond to a modified example of the non-volatile memory device illustrated in FIG. 1, and thus repeated descriptions thereof will be omitted.

Referring to FIG. 17, at least one bit line BL1 may be commonly connected to at least one first NAND set NS1 and at least one second NAND set NS2. The first and second NAND sets NS1 and NS2 may be arranged to face each other so as to share a body. At least one common source line CSL may be commonly connected to the first and second NAND sets NS1 and NS2.

A plurality of first word lines WL1o through WLno may be commonly coupled with the first NAND set NS1 and a plurality of second word lines WL1e through WLne may be commonly coupled with the second NAND set NS2. A plurality of first string selection lines SSL1o through SSLmo may be commonly coupled with the first NAND set NS1 and a plurality of second string selection lines SSL1e through SSLme may be commonly coupled with the second NAND set NS2. A first ground selection line GSLo may be commonly coupled with the first NAND set NS1 and a second ground selection line GSLe may be commonly coupled with the second NAND set NS2.

The first string selection lines SSL1o through SSLmo, the first word lines WL1o through WLno, the first ground selection line GSLo, and the common source line CSL may be arranged under the first and second NAND sets NS1 and NS2. The second string selection lines SSL1e through SSLme, the second word lines WL1e through WLne, and the second ground selection line GSLe may be arranged on the first and second NAND sets NS1 and NS2.

According to the current embodiment, data processing capacity may be increased by separately operating the first and second NAND sets NS1 and NS2.

Alternatively, the first string selection lines SSL1o through SSLmo and the second string selection lines SSL1e through SSLme may be arranged on or under the first and second NAND sets NS1 and NS2 without being separated from each other, and thus may be replaced by, for example, the first through mth string selection lines SSL1 through SSLm illustrated in FIG. 2. Likewise, the first ground selection line GSLo and the second ground selection line GSLe may be arranged on or under the first and second NAND sets NS1 and NS2 without being separated from each other and thus may be replaced by, for example, the ground selection line GSL illustrated in FIG. 2.

In example embodiments, memory cells MC of the first NAND set NS1 and the memory cells MC of the second NAND set NS2 may operate independently from each other by separately operating the first word lines WL1o through WLno and the second word lines WL1e through WLne. Thus, in example embodiments, data processing capacity may also be increased by separately operating the first and second NAND sets NS1 and NS2.

Figure 18:
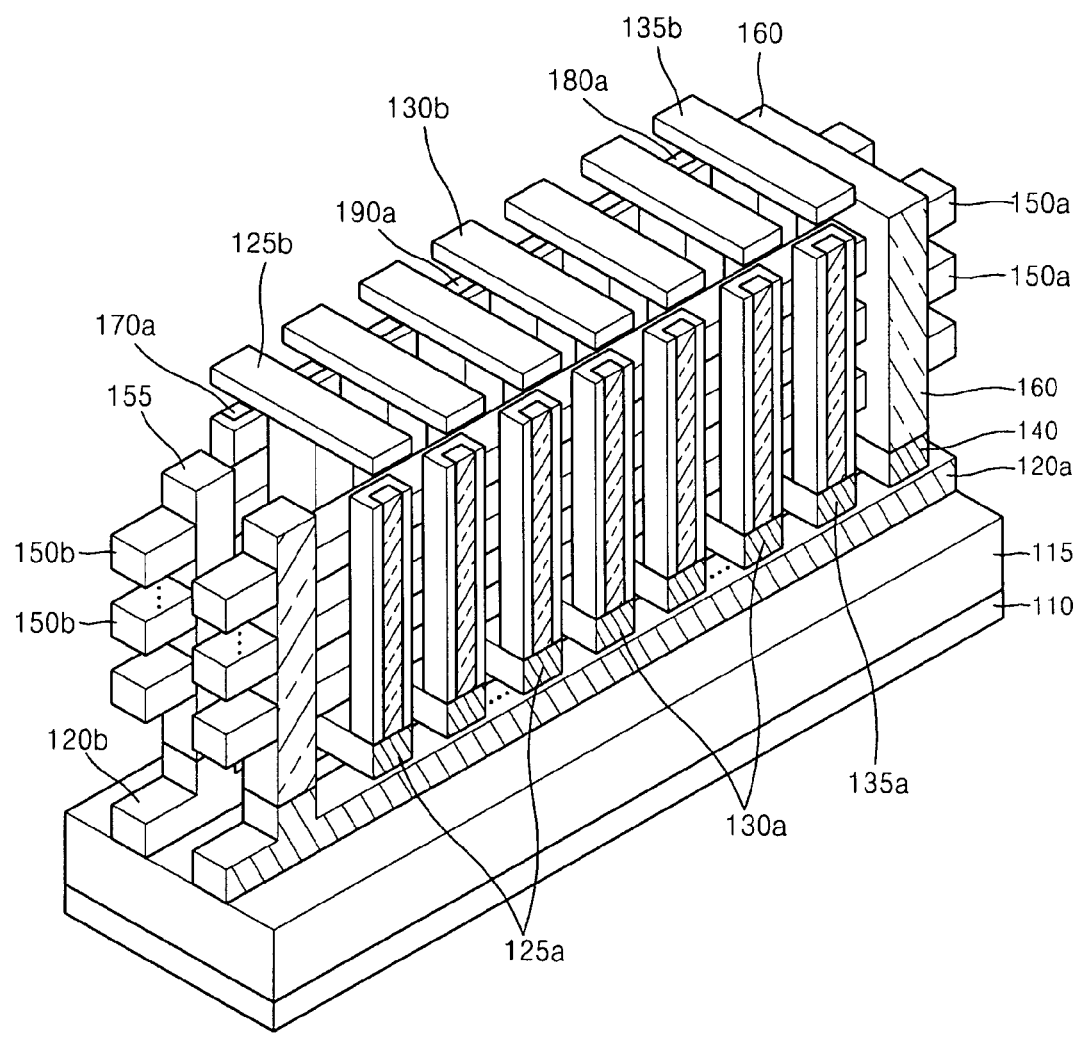
Figure 19:
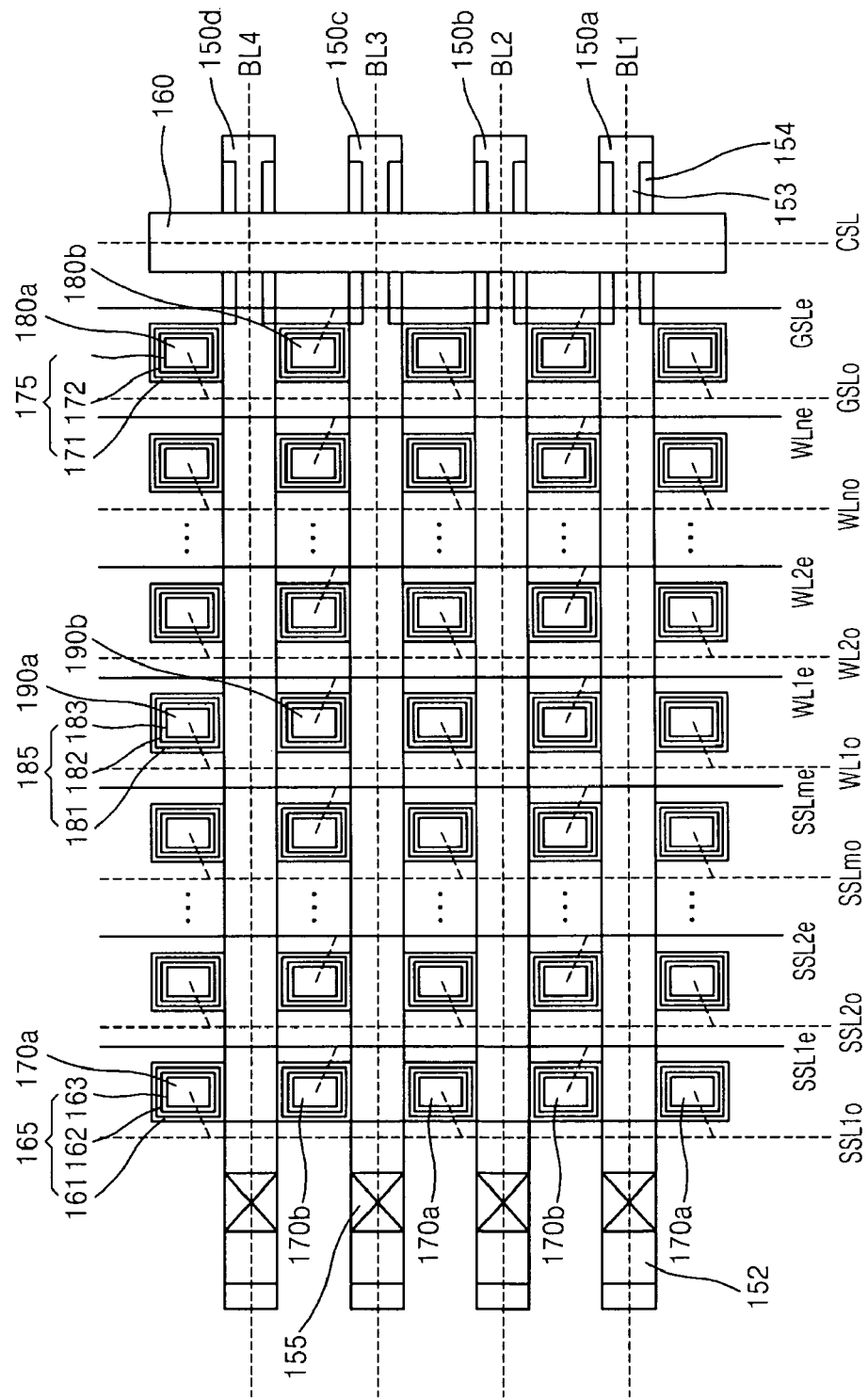

FIG. 18 is a perspective view of a non-volatile memory device according to example embodiments. FIG. 19 is a plan view of the non-volatile memory device illustrated in FIG. 18. The non-volatile memory device according to example embodiments may be similar to the structure illustrated in FIG. 17 and may be described in conjunction with the descriptions of FIGS. 10 through 13.

Referring to FIGS. 18 and 19, bit lines 120a and 120b, or BL1 through BL4 may be connected to semiconductor layers 150a through 150d via first contact plugs 155. A common source line 140 or CSL may be connected to the semiconductor layers 150a through 150d via second contact plugs 160.

First control gate electrodes 190a may be arranged on one of the side surfaces of the semiconductor layers 150a through 150d and second control gate electrodes 190b may be arranged on the other side surfaces of the semiconductor layers 150a through 150d. The first and second control gate electrodes 190a and 190b may be arranged on opposite side surfaces of the semiconductor layers 150a through 150d. The first and second control gate electrodes 190a and 190b may be alternately arranged across the semiconductor layers 150a through 150d.

The first control gate electrodes 190a may be commonly connected to first word lines 130a or WL1o through WLno and the second control gate electrodes 190b may be commonly connected to second word lines 130b or WL1e through WLne. The first word lines 130a or WL1o through WLno may be arranged under the semiconductor layers 150a through 150d and the second word lines 130b or WL1e through WLne may be arranged on the semiconductor layers 150a through 150d.

First string selection gate electrodes 170a may be arranged on one side surfaces of the semiconductor layers 150a through 150d and second string selection gate electrodes 170b may be arranged on the other side surfaces of the semiconductor layers 150a through 150d. The first and second string selection gate electrodes 170a and 170b may be arranged on opposite side surfaces of the semiconductor layers 150a through 150d. The first and second string selection gate electrodes 170a and 170b may be alternately arranged across the semiconductor layers 150a through 150d.

The first string selection gate electrodes 170a may be commonly connected to first string selection lines 125a or SSL1o through SSLmo and the second string selection gate electrodes 170b may be commonly connected to second string selection lines 125b or SSL1e through SSLme. The first string selection lines 125a or SSL1o through SSLmo may be arranged under the semiconductor layers 150a through 150d and the second string selection lines 125b or SSL1e through SSLme may be arranged on the semiconductor layers 150a through 150d.

First ground selection gate electrodes 180a may be arranged on one of the side surfaces of the semiconductor layers 150a through 150d and second ground selection gate electrodes 180b may be arranged on the other side surfaces of the semiconductor layers 150a through 150d. The first and second ground selection gate electrodes 180a and 180b may be arranged on opposite side surfaces of the semiconductor layers 150a through 150d. The first and second ground selection gate electrodes 180a and 180b may be alternately arranged across the semiconductor layers 150a through 150d.

The first ground selection gate electrodes 180a may be commonly connected to a first ground selection line 135a or GSLo and the second ground selection gate electrodes 180b may be commonly connected to a second ground selection line 135b or GSLe. The first ground selection line 135a or GSLo may be arranged under the semiconductor layers 150a through 150d and the second ground selection line 135b or GSLe may be arranged on the semiconductor layers 150a through 150d.

Table 2 shows a 1/2 bit operation of the non-volatile memory device illustrated in FIGS. 18 and 19.

TABLE 2

| 1/2 bit | Program | Read | Erase |
|---|---|---|---|
| SEL_BL | 0 V | $V_{read}$ | FT |
| USL_BL | $V_{cc}$ | FT | FT |
| SSLo | Combination of $V_{cc}/V_{off}$ | | FT |
| SSLe | $V_{off}$ | | FT |
| SEL_WLo | $V_{pgm}$ | $V_{ref}$ | 0 V |
| USL_WLo | $V_{pass}$ | $V_{pass2}$ | 0 V |
| WLe | $V_{off}$ | $V_{off}$ | 0 V |
| GSLo | $V_{off}$ | $V_{cc}$ | FT |
| GSLe | $V_{off}$ | $V_{off}$ | FT |
| CSL/BD | 0 V | 0 V | $V_{ers}$ |

In the 1/2 bit operation, data may be stored in memory cells MC coupled with first word lines WLo. In example embodiments, operations of a bit line BL, the first word lines WLo, first string selection lines SSLo, first ground selection line GSLo, and a common source line CSL are the same as the operations described in Table 1. However, in the 1/2 bit operation, a turn-off voltage Voff may be applied to second word lines WLe, second string selection lines SSLe, a second ground selection line GSLe.

Table 3 shows a 2/2 bit operation of the non-volatile memory device illustrated in FIGS. 18 and 19.

TABLE 3

| 2/2 bit | Program | Read | Erase |
|---|---|---|---|
| SEL_BL | 0 V | $V_{read}$ | FT |
| USL_BL | $V_{cc}$ | FT | FT |
| SSLe | Combination of $V_{cc}/V_{off}$ | | FT |
| SSLo | 0 V | | FT |
| SEL_WLe | $V_{pgm}$ | $V_{ref}$ | 0 V |
| USL_WLe | $V_{pass}$ | $V_{pass2}$ | 0 V |
| WLo | $V_{off}$ | $V_{off}$ | 0 V |
| GSLe | $V_{off}$ | $V_{cc}$ | FT |
| GSLo | $V_{off}$ | $V_{off}$ | FT |
| CSL/BD | 0 V | 0 V | $V_{ers}$ |

In the 2/2 bit operation, data may be stored in memory cells MC coupled with second word lines WLe. In this case, operations of a bit line BL, the second word lines WLe, second string selection lines SSLe, a second ground selection line GSLe, and a common source line CSL are the same as the operations described in Table 1. However, in the 2/2 bit operation, a turn-off voltage Voff may be applied to first word lines WLo, first string selection lines SSLo, and a first ground selection line GSLo.

By using the operations described above with reference to Tables 2 and 3, data of at least two bits may be processed in a unit cell. Thus, the non-volatile memory device according to example embodiments may support a multi-bit operation.

Figure 20:
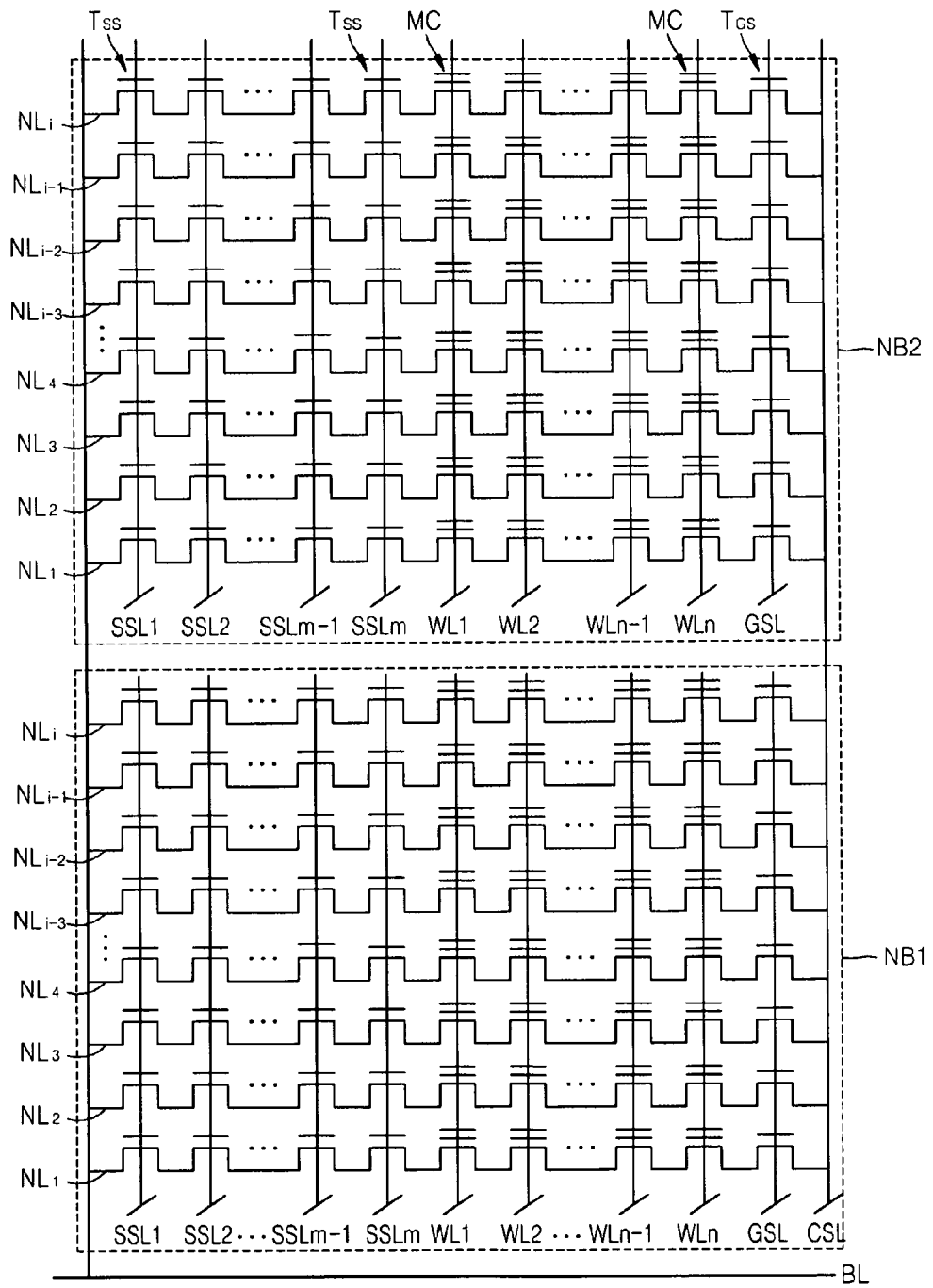

FIG. 20 is a circuit diagram of a non-volatile memory device according to another embodiment of the inventive concept. The non-volatile memory device according to the current embodiment may use the non-volatile memory device illustrated in FIG. 1 and thus repeated descriptions thereof may be omitted.

Referring to FIG. 20, a plurality of NAND blocks, e.g., first and second NAND blocks NB1 and NB2 may be stacked on one another. The number of NAND blocks, i.e., the first and second NAND blocks NB1 and NB2 may be appropriately selected according to capacity of the non-volatile memory device and the current embodiment is not limited by the number of NAND blocks. A stacked NAND cell array and signal lines in the first and second NAND blocks NB1 and NB2 may be described in conjunction with the descriptions of FIG. 1. However, a bit line BL and a common source line CSL may be commonly connected to first through ith NAND strings NL1 through NLi in the first and second NAND blocks NB1 and NB2.

Figure 21:
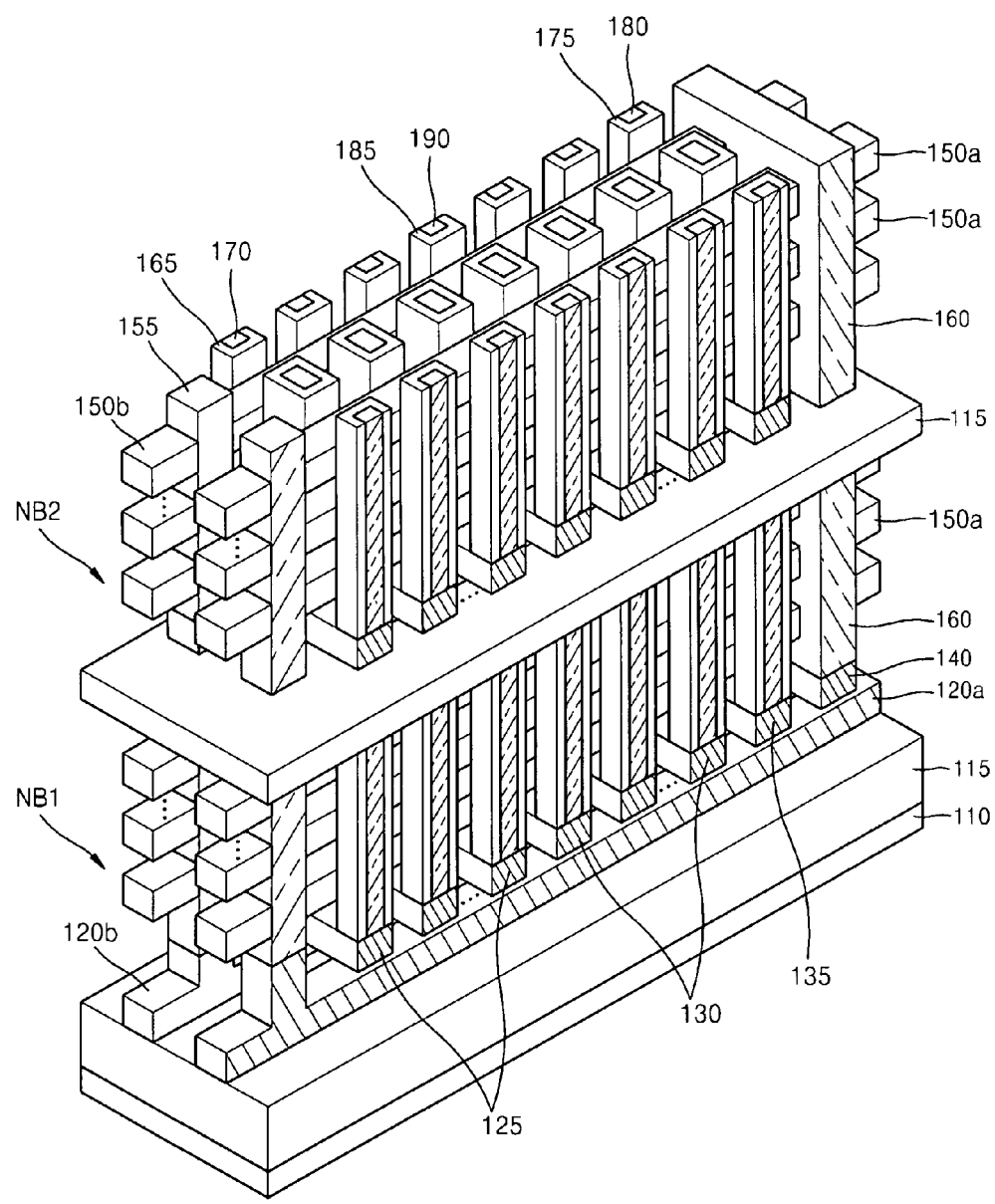

FIG. 21 is a perspective view of a non-volatile memory device according to example embodiments. The non-volatile memory device according to example embodiments may use the non-volatile memory device illustrated in FIG. 19.

Referring to FIG. 21, first and second NAND blocks NB1 and NB2 may be stacked on a substrate 110. The structure of the first and second NAND blocks NB1 and NB2 may be described in conjunction with the descriptions of FIGS. 10 through 13. First contact plugs 155 of the first and second NAND blocks NB1 and NB2 may be perpendicularly connected to each other. Also, second contact plugs 160 of the first and second NAND blocks NB1 and NB2 may be perpendicularly connected to each other.

However, string selection lines 125, word lines 130, and ground selection lines 135 in the first NAND block NB1 may be separated from those in the second NAND block NB2 by an insulating layer 115. Thus, the first and second NAND blocks NB1 and NB2 are separately formed and manufacturing reliability may be improved by reducing an aspect ratio in a process of forming the string selection lines 125, the word lines 130, and the ground selection lines 135.

Figure 22:
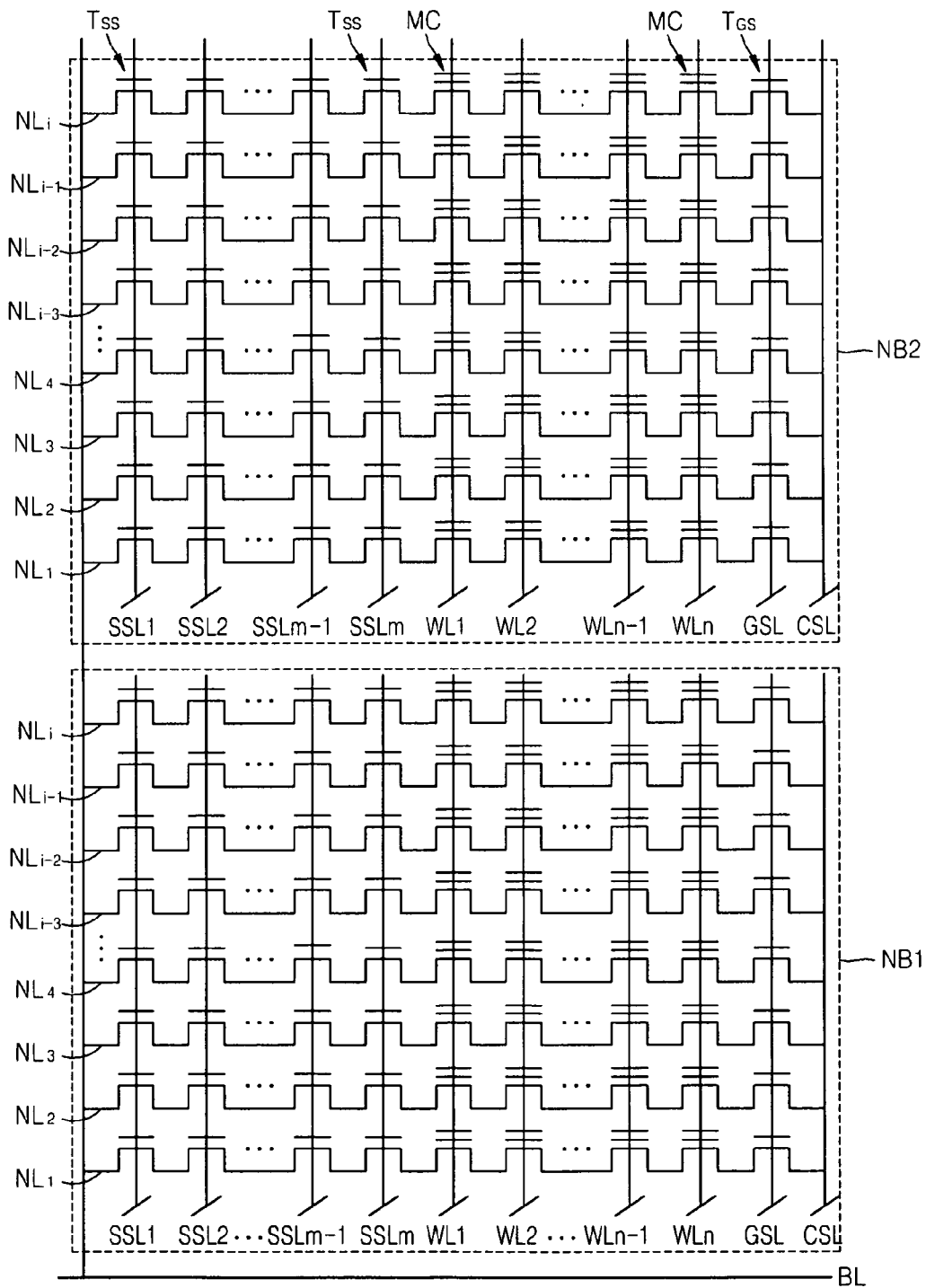

FIG. 22 is a circuit diagram of a non-volatile memory device according to example embodiments. The non-volatile memory device according to example embodiments may correspond to a modified example of the non-volatile memory device illustrated in FIG. 20 and thus repeated descriptions thereof will be omitted.

Referring to FIG. 22, common source lines CSL that may be separated between first and second NAND blocks NB1 and NB2 may be provided.

FIGS. 23 through 26 are cross-sectional views for describing a method of manufacturing a non-volatile memory device, according to example embodiments.

Figure 23:
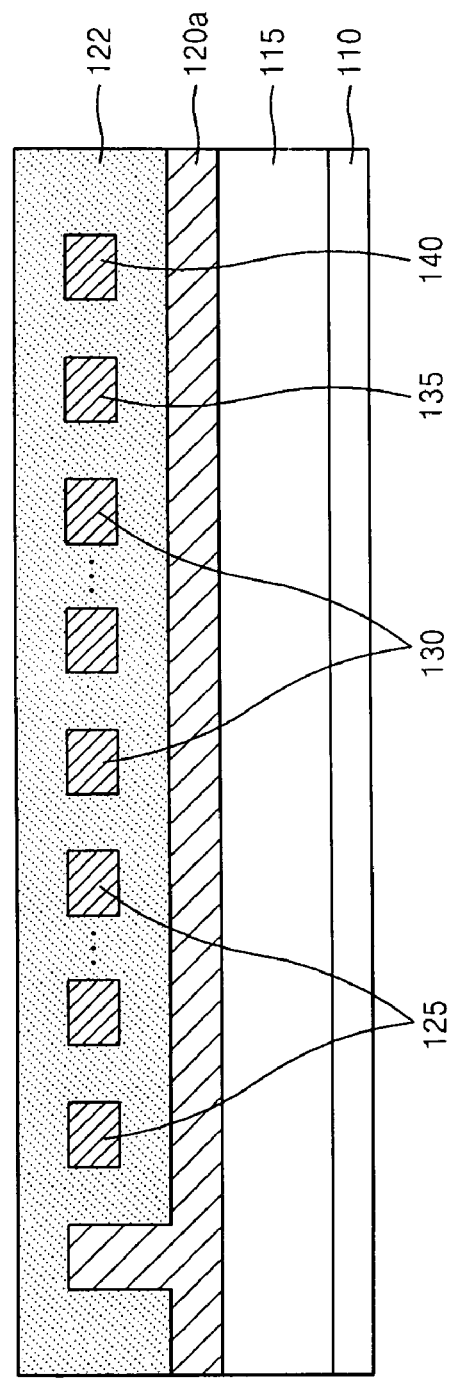

Referring to FIG. 23, an insulating layer 115 may be formed on a substrate 110 and a bit line 120a may be formed on the insulating layer 115. A first portion of an interlayer insulating layer 122 may be formed on the bit line 120a and string selection lines 125, word lines 130, a ground selection line 135, and a common source line 140 may be formed on the first portion of the interlayer insulating layer 122. A second portion of the interlayer insulating layer 122 may further be formed to cover the string selection lines 125, the word lines 130, the ground selection line 135, and the common source line 140. The interlayer insulating layer 122 is illustrated as a single layer but may include a stacked structure of a plurality of insulating layers.

Figure 24:
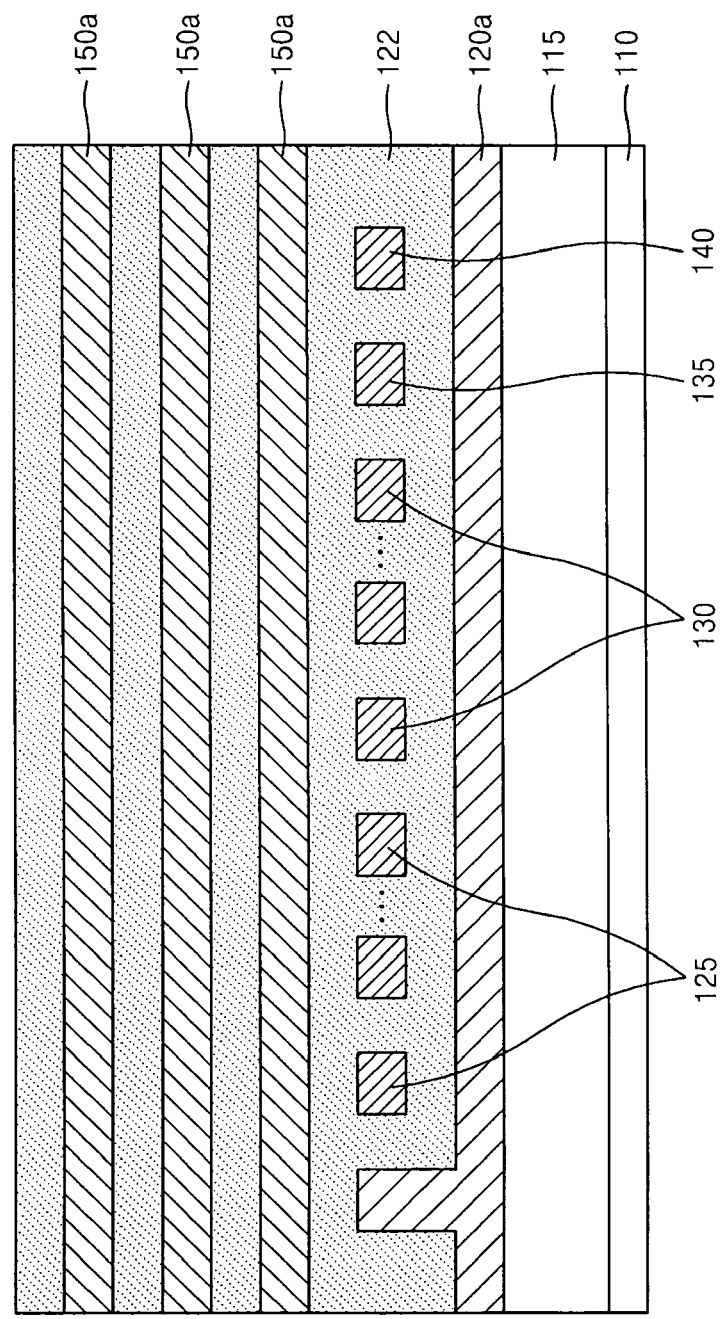

Referring to FIG. 24, a plurality of first semiconductor layers 150a may be stacked by interposing a third portion of the interlayer insulating layer 122 therebetween. The first semiconductor layers 150a may be monocrystalline epitaxial layers or polycrystalline layers.

Figure 25:
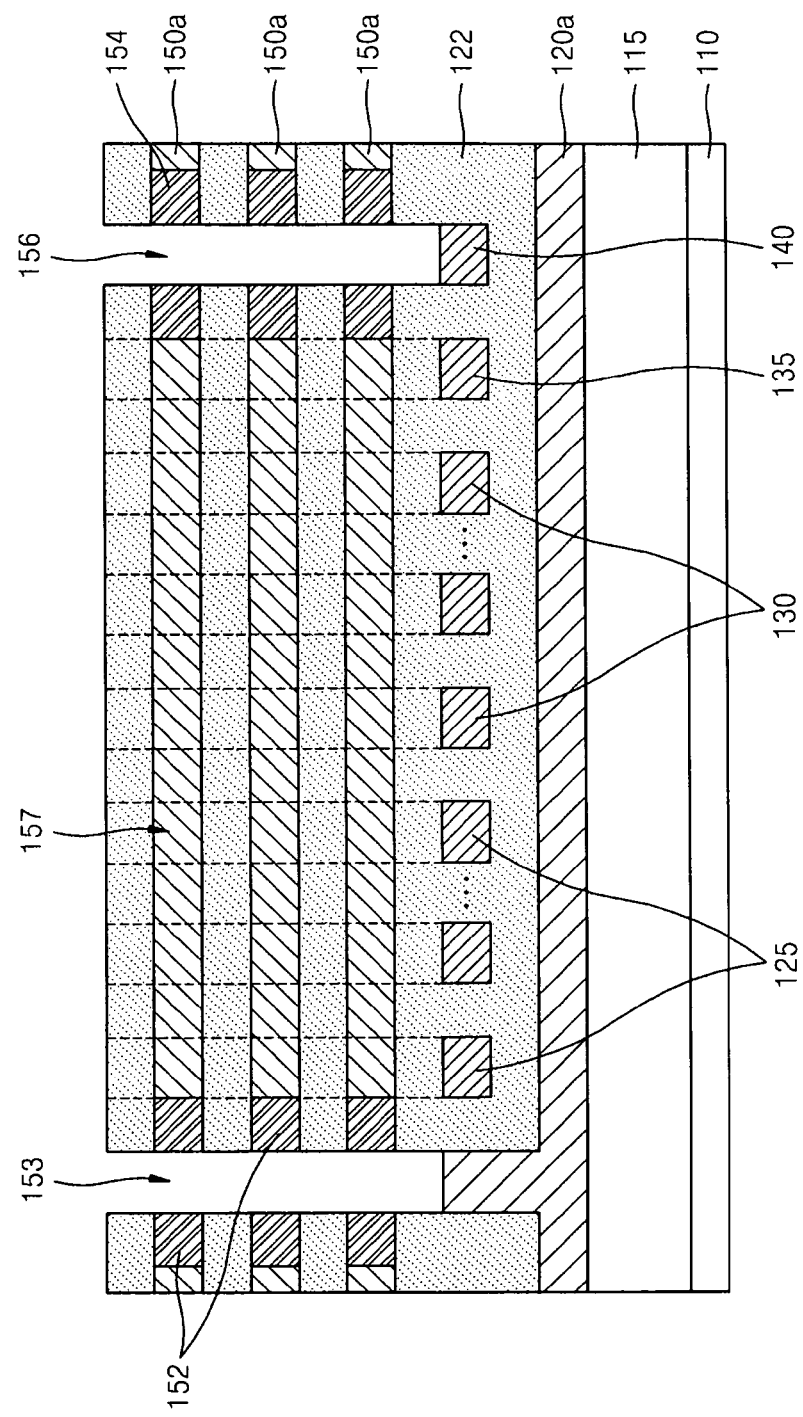

Referring to FIG. 25, drain regions 152 and source regions 154 may be formed by doping the first semiconductor layers 150a with impurities. First and second contact holes 153 and 156 that penetrate the first semiconductor layers 150a may be formed in the drain regions 152 so as to respectively expose the bit line 120a and the common source line 140. Also, third contact holes 157 that penetrate the interlayer insulating layer 154 and extend across the first semiconductor layers 150a may be formed so as to expose side walls of the first semiconductor layers 150a. The third contact holes 157 may expose the string selection lines 125, the word lines 130, and the ground selection line 135.

Figure 26:
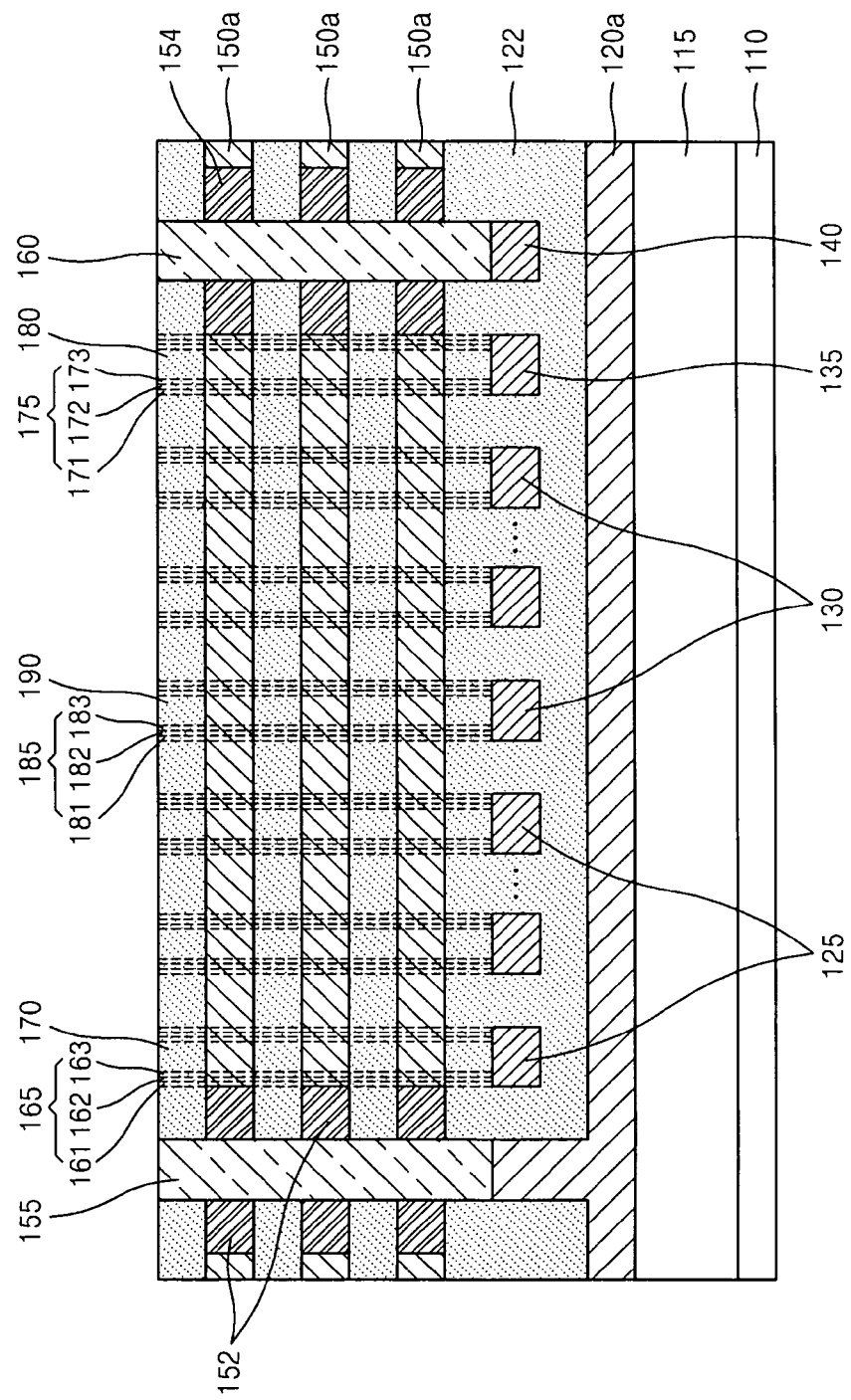

Referring to FIG. 26, a first contact plug 155 may be formed to fill the first contact hole 153 and a second contact plug 160 may be formed to fill the second contact hole 156. Also, string selection gate insulating layers 165 and string selection gate electrodes 170 may be formed in the third contact holes 157 on the string selection lines 125, ground selection gate insulating layers 175 and a ground selection gate electrode 180 may be formed in a third contact hole 157 on the ground selection line 140, and storage media 185 and control gate electrodes 190 may be formed in the third contact holes 157 on the word lines 130.

Figure 27:
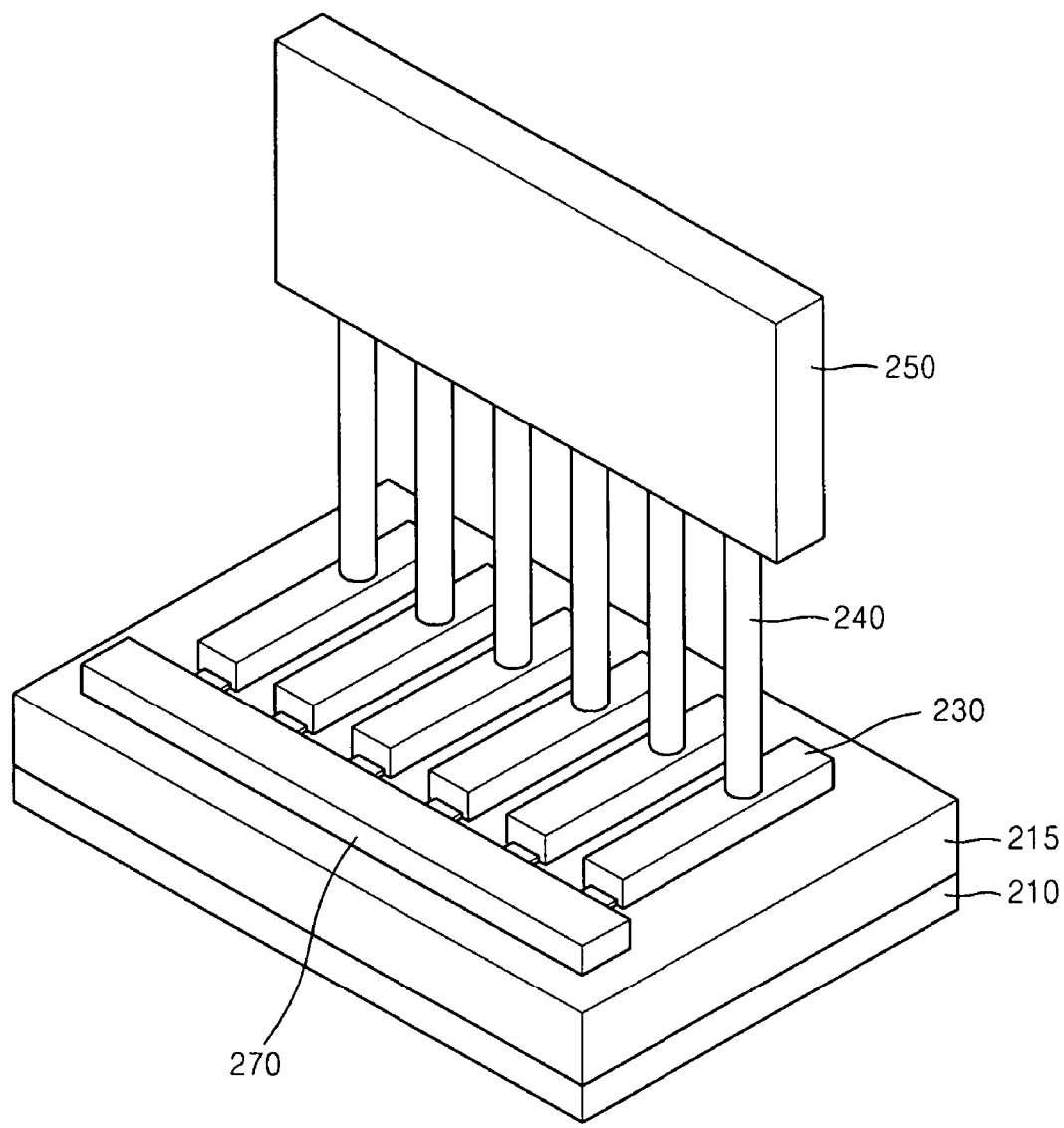

FIG. 27 is a perspective view of a non-volatile memory device according to example embodiments. The non-volatile memory device according to example embodiments may be similar to the non-volatile memory device illustrated in FIG. 1 and thus repeated descriptions thereof may be omitted.

Referring to FIG. 27, a core circuit unit 270 may be provided on a substrate 210. The core circuit unit 270 may be provided under a stacked NAND cell array 250 at the same level as or a similar level to signal lines 230. The core circuit unit 270 and the signal lines 230 may be connected to each other only under the stacked NAND cell array 250. In example embodiments the core circuit unit 270 and the signal lines 230 may be arranged at similar levels under the stacked NAND cell array 250 and thus may be simply connected to each other.

Alternatively, at least some of the signal lines 230 may be arranged on the stacked NAND cell array 250. In example embodiments, the some of the signal lines 230 may be connected to the core circuit unit 270 across the stacked NAND cell array 250.

Figure 28:
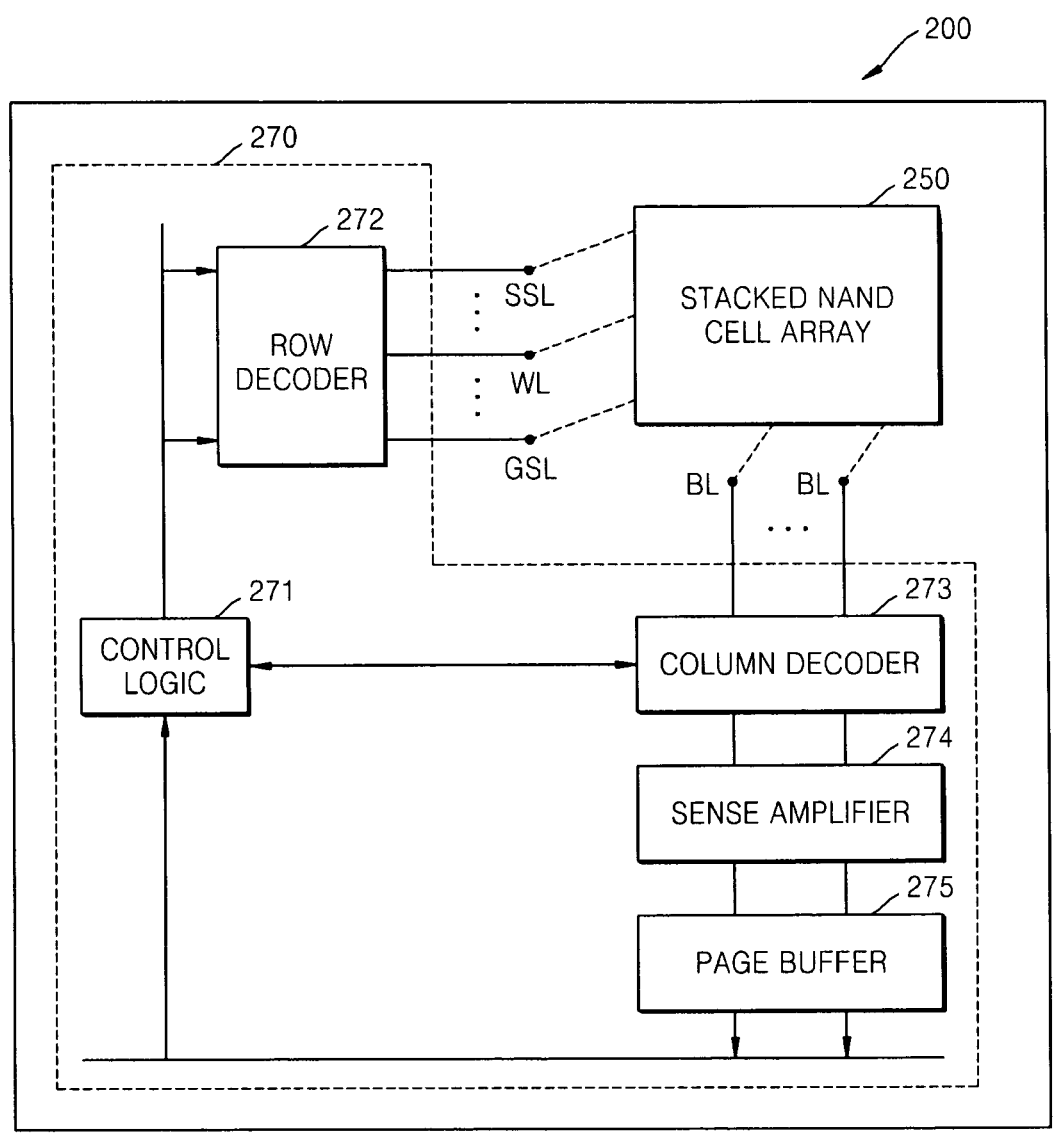

FIG. 28 is a block diagram of a non-volatile memory device 200 according to example embodiments. For example, the non-volatile memory device 200 according to example embodiments may be provided as an example of the non-volatile memory device illustrated in FIG. 27.

Referring to FIG. 28, a core circuit unit 270 may include a control logic 271, a row decoder 272, a column decoder 273, a sense amplifier 274, and/or a page buffer 275. The control logic 271 may communicate with the row decoder 272, the column decoder 273, and/or the page buffer 275. The row decoder 272 may communicate with a stacked NAND cell array 250 via string selection lines SSL, word lines WL, and/or ground selection lines GSL. The column decoder 273 may communicate with the stacked NAND cell array 250 via bit lines BL. The sense amplifier 274 may be connected to the column decoder 273 when a signal is output from the stacked NAND cell array 250 and may not be connected to the column decoder 273 when a signal is transmitted to the stacked NAND cell array 250.

For example, the control logic 271 may transmit a row address signal to the row decoder 272 and the row decoder 272 may decode and transmit the row address signal to the stacked NAND cell array 250 via the string selection lines SSL, the word lines WL, and the ground selection lines GSL. The control logic 271 may transmit a column address signal to the column decoder 273 or the page buffer 275 and the column decoder 273 may decode and transmit the column address signal to the stacked NAND cell array 250 via the bit lines BL. A signal of the stacked NAND cell array 250 may be transmitted to the sense amplifier 274 through the column decoders 273, may be amplified by the sense amplifier 274, and may be transmitted to the control logic 271 through the page buffer 275.

Figure 29:
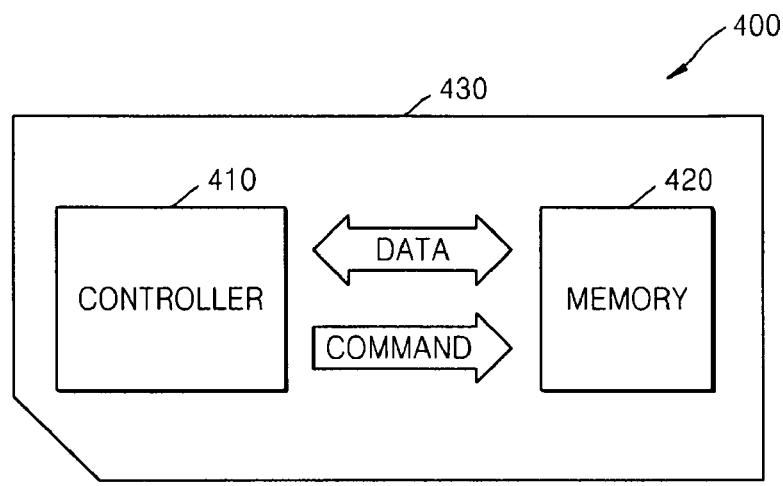

FIG. 29 is a schematic diagram of a memory card 400 according to example embodiments.

Referring to FIG. 29, the memory card 400 may include a controller unit 410 and a memory unit 420 in a housing 430. The controller unit 410 and the memory unit 420 may exchange electrical signals. For example, the memory unit 420 and the controller unit 410 may exchange data according to a command of the controller unit 410. As such, the memory card 400 may store data in the memory unit 420 or may read data from the memory unit 420.

For example, the memory unit 420 may include at least one of the non-volatile memory devices according to example embodiments. Such a memory card 400 may be used as a data storage medium of various mobile devices. For example, the memory card 400 may include a multimedia card (MMC) or a secure digital (SD) card.

Figure 30:
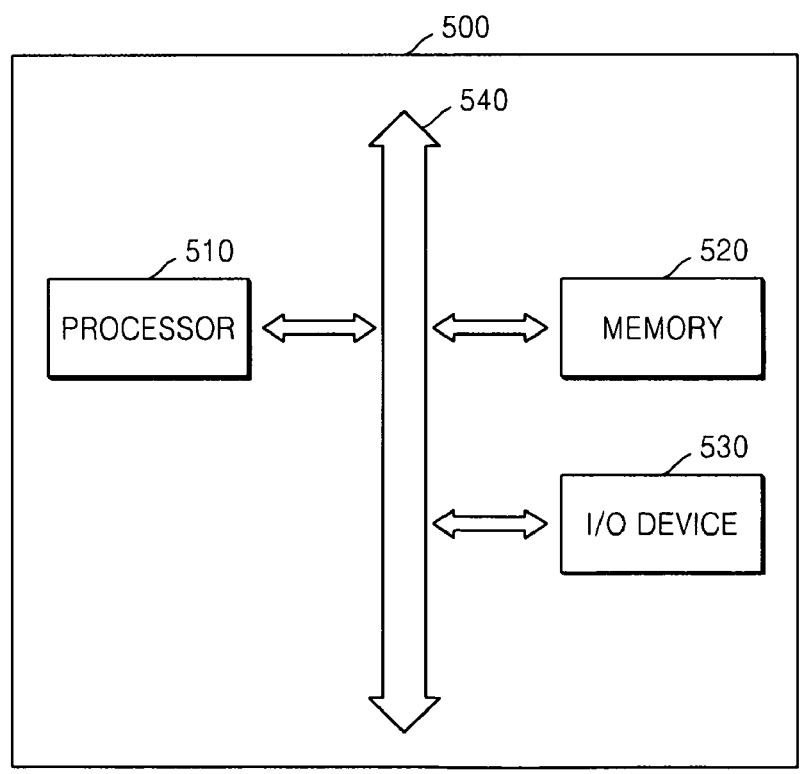

FIG. 30 is a block diagram of an electronic system 500 according to example embodiments.

Referring to FIG. 30, the electronic system 500 may include a processor unit 510, an input/output (I/O) device 530, and a memory unit 520 which may communicate with each other by using a bus 540. The processor unit 510 may perform a program function and may control the electronic system 500. The I/O device 530 may be used to input data to or output data from the electronic system 500. The electronic system 500 may be connected to an external device such as a personal computer (PC) or a network by using the I/O device 530 and thus may exchange data with the external device.

The memory unit 520 may store codes and data required to operate the processor unit 510. For example, the memory unit 420 may include at least one of the non-volatile memory devices according to example embodiments.

For example, such an electronic system 500 may be used to form various electronic control devices that require the memory unit 520, e.g., a mobile phone, an MP3 player, a navigator, a solid state disk (SSD), and household appliances.

While example embodiments have been particularly shown and described with reference to example embodiments thereof, it will be understood by those of ordinary skill in the art that various changes in form and details may be made therein without departing from the spirit and scope of the following claims.

What is claimed is:

1. A non-volatile memory device having a stacked structure, the non-volatile memory device comprising:
    a stacked NAND cell array having at least one NAND set, the at least one NAND set including a plurality of NAND strings, each of the NAND strings including a plurality of string selection transistors, and a number of NAND strings of the at least one NAND set being $2^k$ and a number of string selection transistors of each of the NAND strings being m (m=2×k, k>2); and
    at least one signal line commonly coupled with the at least one NAND set.

2. The non-volatile memory device of claim 1, further comprising:
    a substrate, wherein the plurality of NAND strings is vertically stacked on the substrate and the at least one signal line is on the substrate.

3. The non-volatile memory device of claim 2, wherein the at least one signal line includes a bit line connected to one end of the at least one NAND set.

4. The non-volatile memory device of claim 3, wherein the at least one signal line further includes at least one common source line connected to another end of the at least one NAND set.

5. The non-volatile memory device of claim 3, wherein the at least one signal line further includes a plurality of word lines coupled with the at least one NAND set.

6. The non-volatile memory device of claim 5, wherein
    each of the NAND strings includes a plurality of memory cells, and
    the plurality of word lines are coupled with the plurality of memory cells of the at least one NAND set.

7. The non-volatile memory device of claim 3, wherein the at least one signal line further includes a plurality of string selection lines coupled with the at least one NAND set.

8. The non-volatile memory device of claim 7, wherein
    the plurality of string selection lines are coupled with the plurality of string selection transistors of the at least one NAND set.

9. The non-volatile memory device of claim 3, wherein the at least one signal line further includes at least one ground selection line coupled with the at least one NAND set.

10. The non-volatile memory device of claim 9, wherein
    each of the NAND strings includes at least one ground selection transistor, and
    the at least one ground selection line is coupled with the at least one ground selection transistor of the at least one NAND set.

11. The non-volatile memory device of claim 2, wherein the at least one NAND set includes a plurality of NAND sets arranged on the substrate in a row.

12. The non-volatile memory device of claim 11, wherein
    the at least one signal line includes a plurality of bit lines, and
    the plurality of bit lines is connected to the plurality of NAND sets.

13. The non-volatile memory device of claim 12, wherein
    the at least one signal line further includes a plurality of string selection lines, a plurality of word lines, at least one ground selection line, and a common source line, and
    the plurality of string selection lines, the plurality of word lines, the at least one ground selection line, and the common source line are coupled with the plurality of NAND sets.

14. The non-volatile memory device of claim 2, wherein the at least one signal line is under the stacked NAND cell array.

15. The non-volatile memory device of claim 14, wherein the at least one signal line is coupled with the at least one NAND set via at least one vertical plug on the substrate.

16. The non-volatile memory device of claim 2, wherein the at least one signal line includes
at least one bit line under the stacked NAND cell array and on the substrate, and
a plurality of string selection lines, a plurality of word lines, at least one ground selection line, and a common source line which are under the stacked NAND cell array and on the at least one bit line.

17. The non-volatile memory device of claim 2, further comprising:
a core circuit unit on the substrate, wherein the core circuit unit is electrically connected to the at least one signal line.

18. The non-volatile memory device of claim 17, wherein the at least one signal line is under the stacked NAND cell array, and
the core circuit unit and the at least one signal line are connected to each other only under the stacked NAND cell array.

19. The non-volatile memory device of claim 18, wherein the core circuit unit includes a row decoder connected to a plurality of string selection lines, a plurality of word lines, and at least one ground selection line.

20. The non-volatile memory device of claim 18, wherein the at least one signal line includes at least one bit line and the core circuit unit includes a column decoder connected to the at least one bit line.

21. The non-volatile memory device of claim 18, wherein the core circuit unit includes
a row decoder connected to a portion of the at least one signal line,
a column decoder connected to another portion of the at least one signal line,
a sense amplifier coupled with the column decoder,
a page buffer coupled with one of the sense amplifier and the column decoder, and
a control logic coupled with the row decoder, the column decoder, and the page buffer.

22. The non-volatile memory device of claim 2, wherein the at least one signal line includes a bit line connected to one end of the at least one NAND set and a plurality of string selection lines coupled with the plurality of string selection transistors of the at least one NAND set, and
the plurality of string selection transistors of each the NAND strings includes at least one depletion-mode string selection transistor.

23. The non-volatile memory device of claim 22, wherein a number of string selection transistors of each of the NAND strings is less than a number of NAND strings of the at least one NAND set.

24. The non-volatile memory device of claim 22, wherein the string selection transistors of each of the NAND strings includes k enhancement-mode string selection transistors and k depletion-mode string selection transistors.

25. The non-volatile memory device of claim 22, wherein each of the string selection lines is coupled with $2^{k-1}$ enhancement-mode string selection transistors of the at least one NAND set.

26. A non-volatile memory device having a stacked structure, the non-volatile memory device comprising:
a plurality of NAND blocks stacked on a substrate, wherein each of the NAND blocks includes the non-volatile memory device of claim 1, the plurality of NAND strings of each of the NAND blocks being vertically stacked on the substrate, and the at least one signal line is on the substrate.

27. The non-volatile memory device of claim 26, wherein the at least one signal line of a lower most NAND block from among the plurality of NAND blocks includes at least one bit line under the stacked NAND cell array of the lower most NAND block and on the substrate, and connected to the at least one NAND set of the lower most NAND block.

28. The non-volatile memory device of claim 27, wherein the at least one signal line of the lower most NAND block from among the plurality of NAND blocks includes at least one common source line under the stacked NAND cell array of the lower most NAND block and on the substrate, and connected to the at least one NAND set of the lower most NAND block.

29. The non-volatile memory device of claim 27, wherein the at least one signal line of each NAND block includes a plurality of string selection lines, a plurality of word lines, at least one ground selection line, and at least one common source line.

30. A memory card comprising:
a memory unit including the non-volatile memory device of claim 1; and
a controller unit configured to control the memory unit.

31. An electronic system comprising:
a memory unit including the non-volatile memory device of claim 1;
a processor unit communicating with the memory unit via a bus; and
an input/output device communicating with the bus.

* * * * *